(12) United States Patent
Konishi et al.

(10) Patent No.: US 7,176,579 B2
(45) Date of Patent: Feb. 13, 2007

(54) SEMICONDUCTOR MODULE

(75) Inventors: Satoru Konishi, Saku (JP); Tsuneo Endoh, Komoro (JP); Hirokazu Nakajima, Saku (JP); Masaaki Tsuchiya, Tobu (JP)

(73) Assignee: Renesas Technology Corp., Tokyo (JP)

( * ) Notice: Subject to any disclaimer, the term of this patent is extended or adjusted under 35 U.S.C. 154(b) by 294 days.

(21) Appl. No.: 10/733,581

(22) Filed: Dec. 12, 2003

(65) Prior Publication Data

US 2004/0125579 A1 Jul. 1, 2004

(30) Foreign Application Priority Data

Dec. 27, 2002 (JP) ............... 2002-379047

(51) Int. Cl.
*H01L 23/538* (2006.01)
*H01L 23/58* (2006.01)

(52) U.S. Cl. ............ 257/777; 257/724; 361/782; 361/783; 330/66

(58) Field of Classification Search ............... None
See application file for complete search history.

(56) References Cited

U.S. PATENT DOCUMENTS

| | | | | |
|---|---|---|---|---|
| 4,811,082 A * | 3/1989 | Jacobs et al. | ............... | 257/700 |
| 6,178,082 B1 * | 1/2001 | Farooq et al. | ............... | 361/303 |
| 6,265,771 B1 * | 7/2001 | Ference et al. | ............... | 257/706 |
| 6,535,398 B1 * | 3/2003 | Moresco | ............... | 361/792 |
| 6,642,610 B2 * | 11/2003 | Park et al. | ............... | 257/678 |
| 6,849,940 B1 * | 2/2005 | Chan et al. | ............... | 257/706 |
| 6,856,007 B2 * | 2/2005 | Warner | ............... | 257/678 |
| 6,900,991 B2 * | 5/2005 | Patel et al. | ............... | 361/782 |
| 6,930,334 B2 * | 8/2005 | Suzuki et al. | ............... | 257/275 |
| 2001/0011766 A1 * | 8/2001 | Nishizawa et al. | ............... | 257/685 |
| 2002/0074668 A1 * | 6/2002 | Hofstee et al. | ............... | 257/777 |
| 2005/0122698 A1 * | 6/2005 | Ho et al. | ............... | 361/761 |

FOREIGN PATENT DOCUMENTS

JP 9-116091 5/1997
JP 9-232504 9/1997

OTHER PUBLICATIONS

Electronic Materials and Processes Handbook, 2nd ed., McGraw-Hill, Inc., 1994, Harper & Sampson, editors, pp. 1.10 and 1.11.*

* cited by examiner

*Primary Examiner*—John B. Vigushin
(74) *Attorney, Agent, or Firm*—Mattingly, Stanger, Malur & Brundidge, P.C.

(57) ABSTRACT

The present invention realizes the miniaturization of a semiconductor module. The semiconductor module includes a module board having external electrode terminals and a heat radiation pad over a lower surface thereof, a first semiconductor chip incorporating an initial-stage transistor of a high frequency power amplifying device therein, a second semiconductor chip incorporating a next-stage transistor and a final-stage transistor therein, and an integrated passive device which constitutes a matching circuit. At least one of the first semiconductor chip and the second semiconductor chip and the integrated passive device are mounted over an upper surface of the module board in an overlapped manner.

29 Claims, 14 Drawing Sheets

SEMICONDUCTOR MODULE

BACKGROUND OF THE INVENTION

The present invention relates to a semiconductor module, and more particularly to a semiconductor module which can achieve the miniaturization thereof.

As an example of a semiconductor module (semiconductor device) which mounts semiconductor chips in which active elements such as transistors are incorporated and chip parts in which passive elements such as resistors, capacitors and the like are incorporated on a printed wiring board respectively, a hybrid integrated circuit device has been known.

The hybrid integrated circuit device constitutes, for example, a high frequency power amplifying device (high frequency power module) which is incorporated into a mobile telephone (for example, see Patent Document 1).

Further, there has been known a technique which manufactures an IC (integrated circuit device) chip having capacitors in a miniaturized form (for example, see Patent Document 2).

[Patent Document 1]
Japanese Unexamined Patent Publication No. Hei 9(1997)-116091 (pages 5 to 7, FIG. 1, FIG. 3)

[Patent Document 2]
Japanese Unexamined Patent Publication No. Hei 9(1997)-232504 (page2, FIG. 5)

SUMMARY OF THE INVENTION

A large number of electronic parts are incorporated into terminal equipment (mobile telephone or the like) for mobile communication. The rapid miniaturization and the sophistication of functions have been in progress also with respect to a high frequency amplifying device (power amplifier module: PA) which is incorporated into a transmission system of the mobile telephone. As one communication method, the GSM (Global System for Mobile Communication) method has been known. Although a current profile size of a power amplifier module for this GSM method is set such that a longitudinal size is 10 mm and a lateral size is 8 mm, it is expected that the profile size will be set such that a longitudinal size is 6 mm and a lateral size is 5 mm as a main stream of the next generation module.

Further, also in the CDMA (Code Division Multiple Access) field, although a profile size of a power amplifier module is currently set such that a longitudinal size is 6 mm and a lateral size is 6 mm, it is expected that the profile size will become smaller such that the longitudinal size is 5 mm and a lateral size is 5 mm and, thereafter, the profile size in which the longitudinal size is 4 mm and the lateral size is 4 mm will be further requested sequentially. Further, the same goes for a GSM product with respect to this request.

In such an ultra-miniaturized power amplifier module, with mere mounting of parts two-dimensionally on a surface of a module board having the printed wiring board constitution, chip parts including semiconductor chips in which active elements such as transistors or the like are incorporated, resisters (chip resistors), capacitors (chip capacitors) and the like cannot be mounted and hence, three-dimensional mounting becomes necessary.

Accordingly, it is an object of the present invention to achieve the miniaturization of a semiconductor module in which a plurality of semiconductor chips and a plurality of electronic parts are incorporated.

The above-mentioned objects, other objects and novel features of the present invention will become apparent from the description of this specification and attached drawings.

To briefly explain the summary of typical inventions among inventions disclosed in this specification, they are as follows.

(1) A semiconductor module of the present invention includes a module board having wiring on an upper surface thereof and external electrode terminals on a lower surface thereof, first semiconductor chips and second semiconductor chips including active elements, and an integrated passive device formed by integrating a plurality of passive elements, wherein at least one of the first semiconductor chips and the second semiconductor chips and the integrated passive device are mounted on the upper surface of the module board in an overlapped manner. Recesses are formed in the upper surface of the module board, while heat radiation pads made of a conductor are formed over a lower surface of the module board. A plurality of vias which vertically penetrate the module board are formed in bottoms of the recesses and these vias are connected to the heat radiation pads. Second semiconductor chips are mounted on the bottom of the recesses. Electronic parts (passive parts) such as first semiconductor chips, resistors, capacitors and the like are mounted on the upper surface of the module board outside the recesses. The integrated passive device is mounted on an upper surface of the first semiconductor chip. The electrodes formed over upper surfaces of the first and the second semiconductor chips and the integrated passive device and wiring formed over the upper surface of the module board are electrically connected with each other by conductive wires. These first and second semiconductor chips, integrated passive device, wires and the like are covered with a sealing portion formed over the upper surface of the module board. The sealing portion and the module board have the same size and are overlapped to each other in alignment. The first semiconductor chip and the second semiconductor chip include amplifying circuits and, at the same time, outputs of the first semiconductor chips are inputted to the second semiconductor chips thus constituting a high frequency power amplifying device. An input matching circuit which is connected to the amplifying circuit of the first semiconductor chip and an inter-stage matching circuit which is connected between amplifying circuits of the first and the second semiconductor chips are incorporated into the integrated passive device.

(2) In the above-mentioned constitution (1), an output matching circuit is connected to an output portion of the amplifying circuit of the second semiconductor chip and the output matching circuit is incorporated into the integrated passive device mounted on the upper surface of the module board.

PREFERRED EMBODIMENTS OF THE PRESENT INVENTION

Preferred embodiments of the present invention are explained in detail in conjunction with attached drawings. Here, in all drawings for explaining the embodiments of the present invention, parts having identical functions are given same symbols and their repeated explanation is omitted.

(Embodiment 1)

Figure 1:
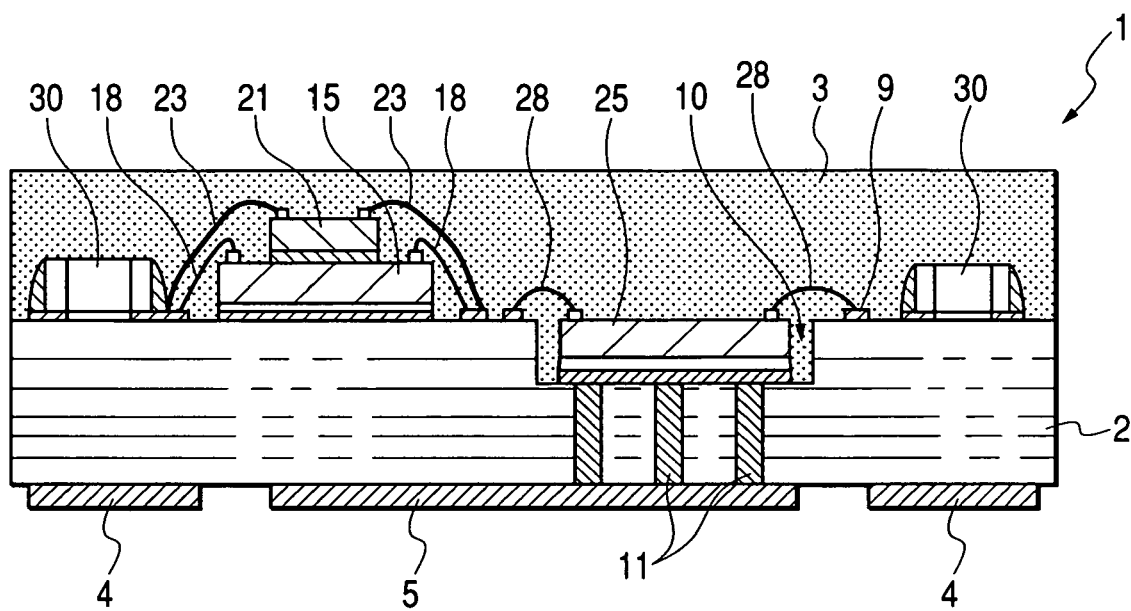
FIG. 1 is a schematic cross-sectional view of a semiconductor module according to one embodiment (embodiment 1) of the present invention.
Figure 2:
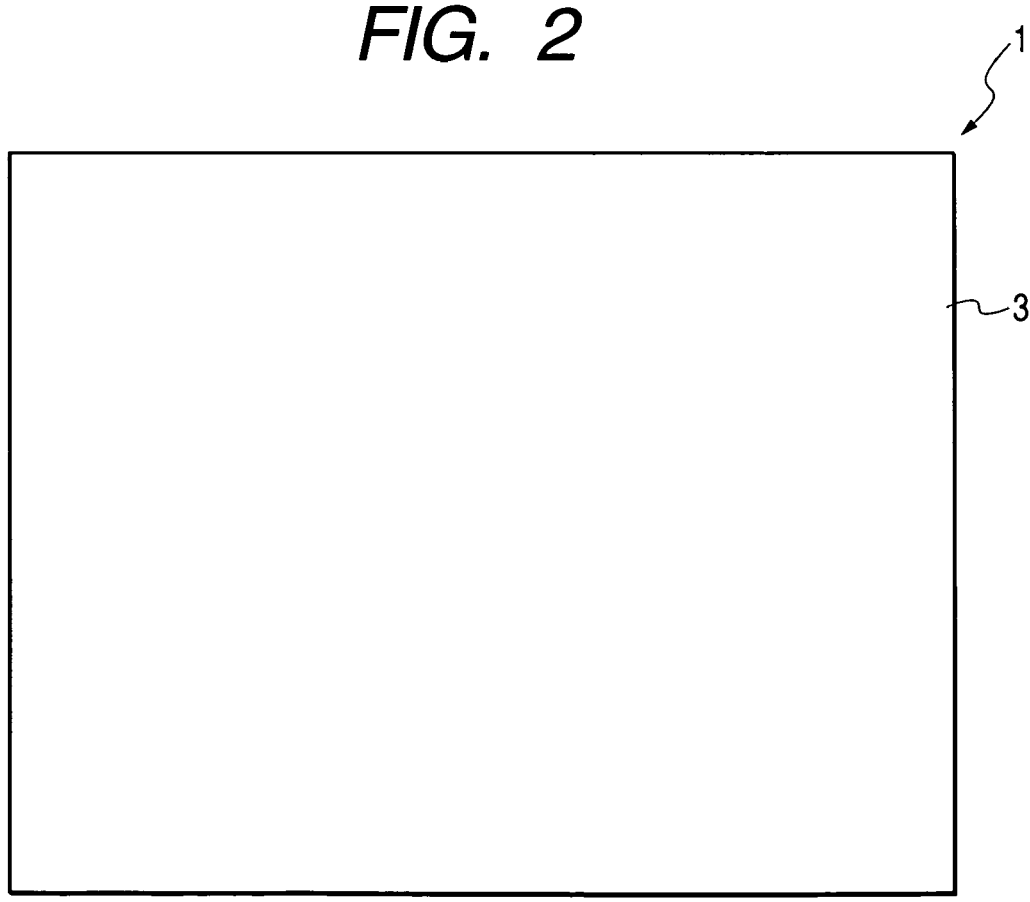
FIG. 2 is a plan view of the semiconductor module.
Figure 3:
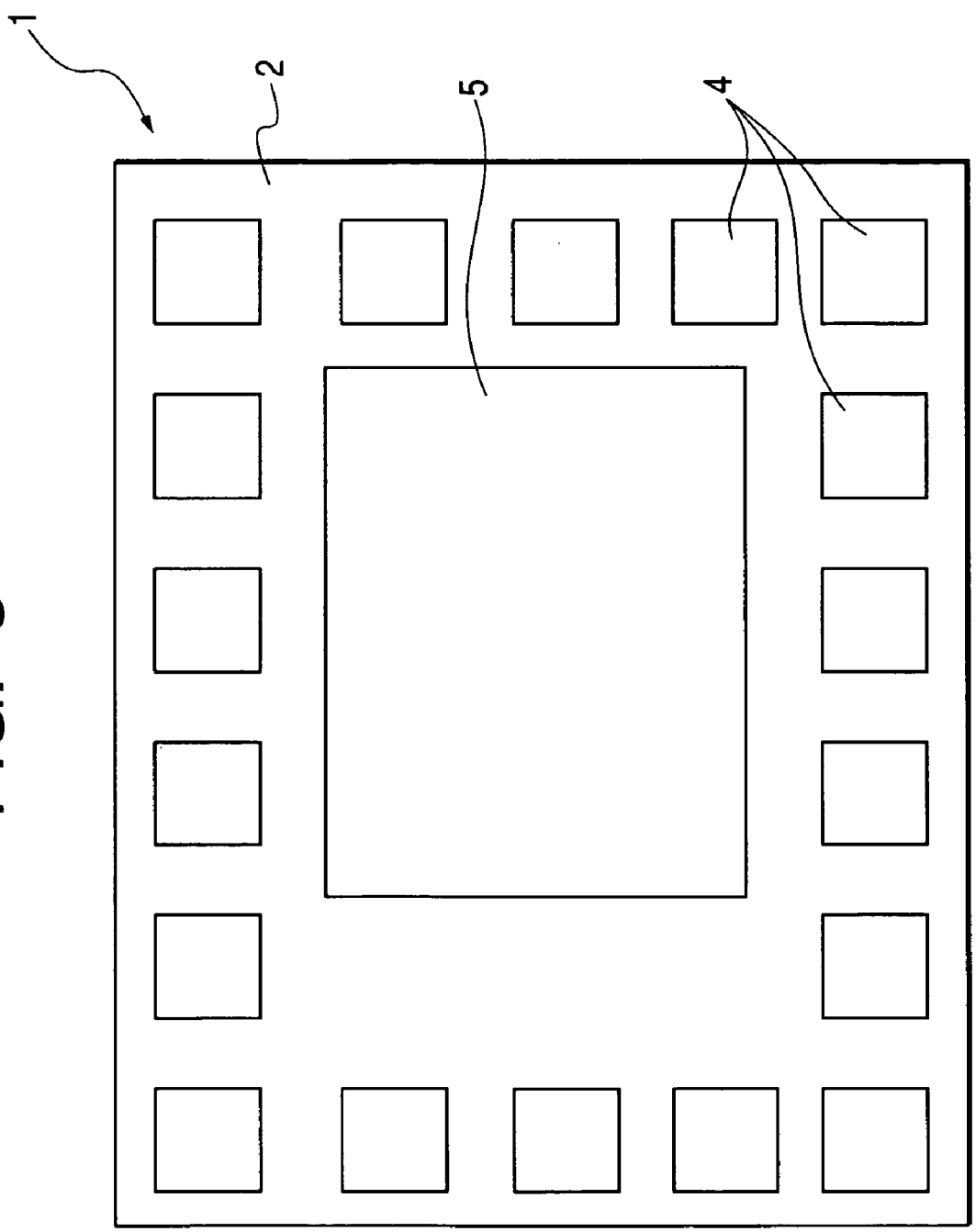
FIG. 3 is a bottom view of the semiconductor module.
Figure 4:
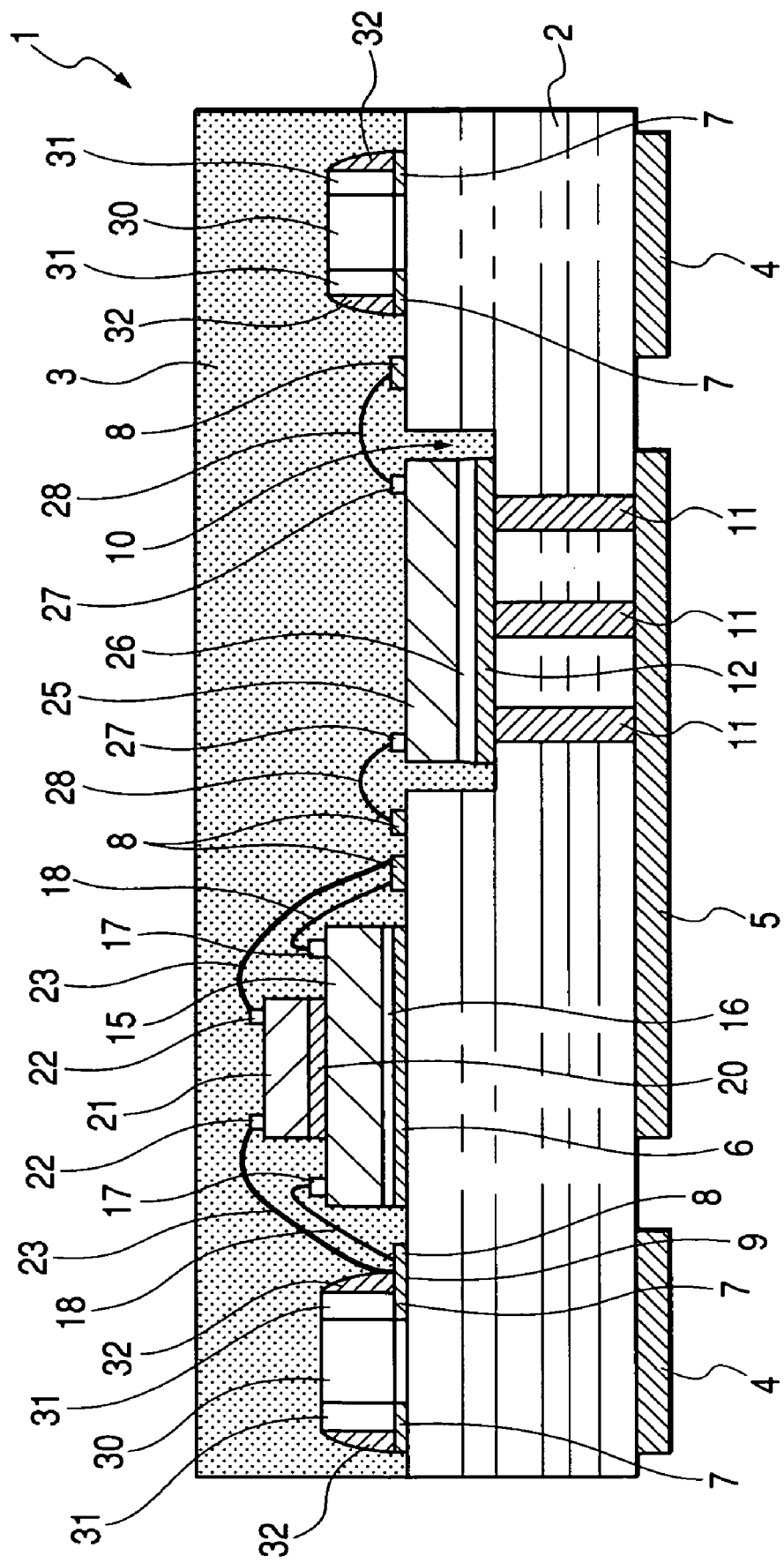
FIG. 4 is a schematic enlarged cross-sectional view of the semiconductor module.
Figure 5:
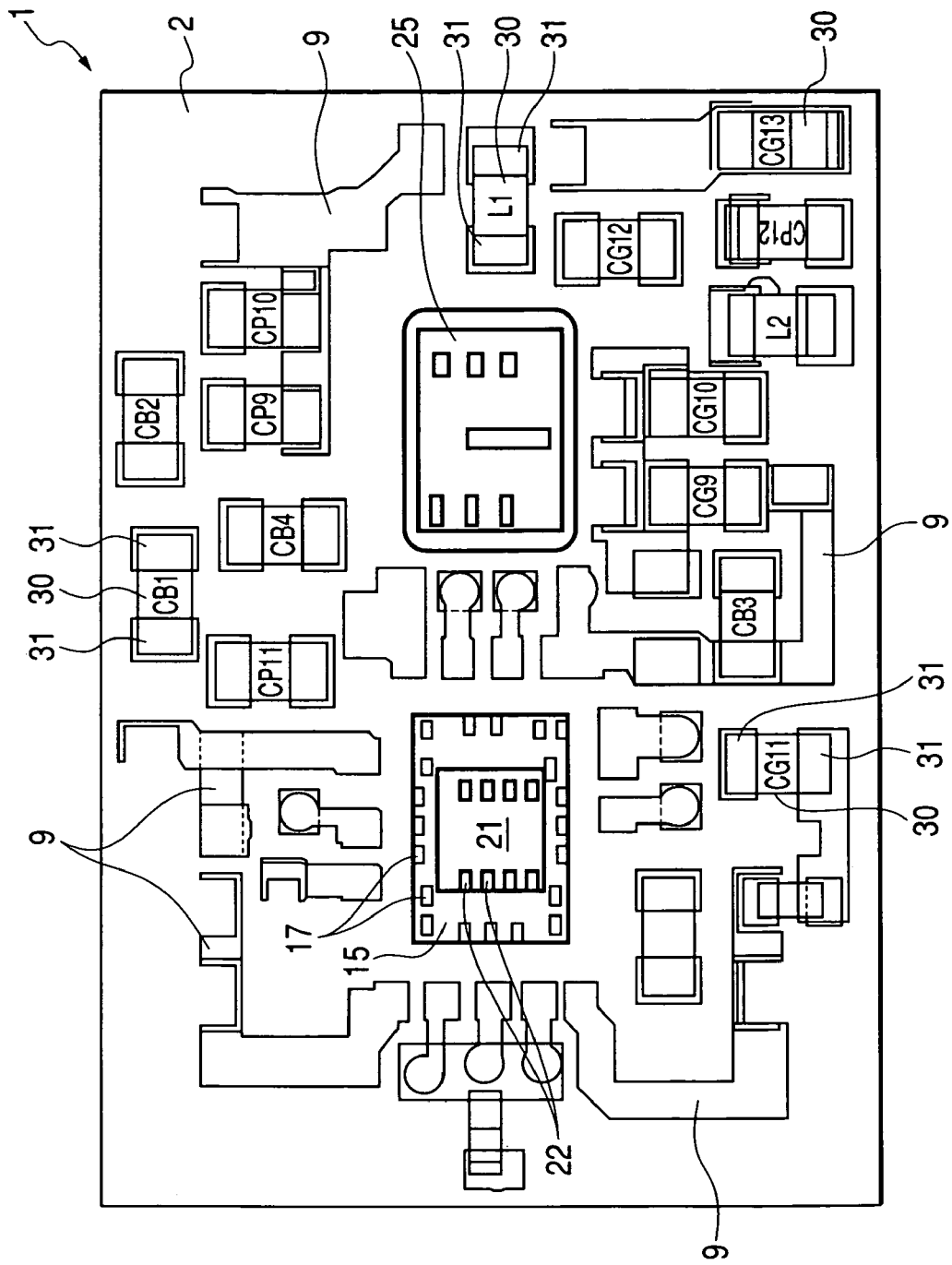
FIG. 5 is a schematic plan view showing an arrangement state of electronic parts in the semiconductor module.

FIG. 1 to FIG. 8 are views related with a semiconductor module which constitutes one embodiment (embodiment 1) of the present invention. FIG. 1 to FIG. 7 are views related with the structure of the semiconductor module. FIG. 1 is a schematic cross-sectional view of the semiconductor module, FIG. 2 is a plan view thereof, FIG. 3 is a bottom view thereof, FIG. 4 is a schematic enlarged cross-sectional view thereof and FIG. 5 is a view showing a layout of electronic parts on a module board. In FIG. 1, among symbols which explain respective parts, some of parts are shown, while the detail of the respective parts is shown in FIG. 4.

The semiconductor module (semiconductor device) 1 of this embodiment 1 includes a module board 2 having a quadrangular shape in appearance, a sealing portion (a package) 3 which is formed over an upper surface of the module board 2 in an overlapped manner, and a plurality of external electrode terminals 4 and heat radiation pads 5 which are formed over a lower surface of the module board 2.

In manufacturing the semiconductor module 1, electronic parts including semiconductor chips are mounted on an upper surface of a module base board and, thereafter, a resin sealing layer having a fixed height is formed over an upper surface of the module base board such that the resin sealing layer covers the electronic parts and the like and, subsequently, the module base board is cut in the longitudinal direction as well as in the lateral direction including the resin sealing layer which is overlapped to the module base board thus manufacturing a plurality of semiconductor modules 1 at a time whereby it is possible to provide the structure in which the module board 2 and the sealing portion 3 have the same size and are overlapped to each other in alignment. Accordingly, it is possible to provide the structure in which side faces of the module board 2 and side faces of the sealing portion 3 are aligned with each other and end portions of the sealing portion 3 are not positioned outside end portions of the module board 2. With such a manufacturing method, the semiconductor module 1 can be manufactured in a miniaturized size. Here, due to the above-mentioned cutting operation, the module base board is formed into the module boards and the resin sealing layer is formed into the sealing portions.

The module board 2 is constituted of a printed circuit board (PCB), wherein the module board 2 includes, as shown in FIG. 1, conductive layers having given wiring patterns on upper and lower surfaces and inside (not shown) thereof and these conductive layers are electrically connected to each other through conductors filled in through holes (not shown). The module board 2 has the structure in which a plurality of conductive layers (wiring) are inserted between a plurality of dielectric layers (insulation films). In this embodiment 1, although not particularly limited, the dielectric layers are provided in six layers.

The wiring 9 is formed of the conductive layers which are formed over the upper and lower surfaces and the inside of the module board 2 and the conductors which extend vertically. External electrode terminals 4 and heat radiation pads 5 are formed of the conductive layers formed over the lower surface of the module board 2. Chip mounting pads 6, electrode connection pads 7, wire connection pads 8 and the like are formed of the conductive layers formed over the upper surface of the module board 2.

Further, in this embodiment 1, recesses 10 are formed in the upper surface of the module board 2. Further, through holes which penetrate the module board vertically are formed at bottoms of these recesses 10 and, at the same time, conductors are filled in the through holes thus forming vias 11. Further, chip mounting pads 12 are also formed over bottom faces of the recesses 10. The chip mounting pads 12 formed over the bottoms of the recesses 10 and the heat radiation pads 5 are connected to each other through a plurality of vias 11. The heat radiation pad 5 has an area which is larger than an area of the external electrode terminal 4.

The conductive layers and the conductors are formed of metal. For example, the conductive layers which are formed over upper and lower surfaces of the module board 2 are formed of a Ti (lower layer)/TiN layer and a Ti (lower layer)/Al—Cu—Si layer which is formed over the Ti (lower layer)/TiN layer although (not shown). Further, over a surface of the conductive layer to which an adhesive agent and the wire are connected, to facilitate the connection, a plating film made of Ti (lower layer)/Ni, for example, is formed. Further, the inner conductive layers are formed of an Ag conductor and the conductor which is filled in the through holes or via holes is an Ag conductor.

In this embodiment 1, to an upper surface of the chip mounting pad 6, a first semiconductor chip 15 is fixed using an adhesive agent 16. In the first semiconductor chip 15, although the structure thereof is (not shown), a plurality of amplifying circuits which constitute active elements are formed over an upper surface side of a silicon substrate and a predetermined number of electrodes 17 are arranged over an insulation layer which covers an upper surface of the silicon substrate such that a predetermined number of electrodes 17 are exposed. The electrodes 17 are formed along respective sides of the first semiconductor chip 16 having a quadrangular shape. The electrodes 17 of the first semiconductor chip 15 and wire connection pads 8 formed over the module board 2 around the first semiconductor chip 15 are electrically connected using the conductive wires 18.

Further, an integrated passive device 21 is fixed to the center of the first semiconductor chip 15 using an adhesive agent 20. A predetermined number of electrodes 22 are also formed over an upper surface of the integrated passive device 21. The electrode 22 of the integrated passive device 21 and the wire connection pad 8 formed over the module board 2 around the integrated passive device 21 are electrically connected to each other using a conductive wire 23.

To the chip mounting pad 12 formed over the bottom of the recess 10, a second semiconductor chip 25 is fixed using an adhesive agent 26. In the second semiconductor chip 25, although the structure thereof is not shown in the drawing, a plurality of amplifying circuits which constitute active elements are formed over an upper surface side of a silicon substrate and a predetermined number of electrodes 27 are arranged over an insulation layer which covers an upper surface of the silicon substrate such that a predetermined number of electrodes 27 are exposed. The electrodes 27 of the second semiconductor chip 25 and the wire connection pads 8 formed over a periphery of the recess 10 are electrically connected to each other using conductive wires 28. Further, this embodiment adopts the structure in which the chip mounting pad 12 formed over the bottom of the recess 10 and the heat radiation pad 5 are electrically connected with each other through vias 11. Since the vias 11 are formed of metal, the vias 11 exhibit the favorable heat conductivity. Accordingly, heat generated by the second semiconductor chip 25 is rapidly transmitted to the heat radiation pad 5.

In this embodiment 1, the semiconductor substrate (not shown) of the second semiconductor chip 25 is configured such that the semiconductor substrate is electrically connected with the heat radiation pad 5 through the conductive adhesive agent 26, the chip mounting pad 12 and the vias 11. Accordingly, by making the semiconductor substrate of the second semiconductor chip 25 assume a first reference potential, that is, a ground potential, the heat radiation pad 5 also assumes the ground potential.

Over the upper surface of the module board 2, a predetermined number of chip-like electronic parts 30 are mounted. The chip-like electronic part 30 forms electrodes 31 at both ends thereof and these electrode 31 portions are electrically connected with and are fixed to the electrode connection pad 7 which is formed over the upper surface of the module board 2 using an adhesive agent 32. The chip-like electronic parts 30 may include, for example, chip resistors, chip capacitors and chip inductors. As the adhesive agent 32, solder with a small lead content (referred to as "Pb free solder" hereinafter) is used. As the Pb free solder, solder which contains Zn or Bi in Sn, Ag or Cu is used.

The external electrode terminals 4 are, as shown in FIG. 3, arranged along respective sides of a quadrangular bottom surface of the semiconductor module 1 at a predetermined pitch. Further, on a center portion of the bottom surface, the heat radiation pad 5 having an area greatly larger than an area of the external electrode terminal 4 is arranged.

Over the upper surface side of the module board 2, the sealing portion 3 which covers the first semiconductor chips 15, the second semiconductor chips 25, the integrated passive devices 21, the chip-like electronic parts 30, wires 18, 23, 28 and the like is formed. The sealing portion 3 is formed of insulating resin. The sealing portion 3 is formed of, for example, silicone resin having the Young's modulus of 1 to 200 Mpa and the thermal expansion coefficient $\alpha$ of $180 \times 10^{-6}/°$ C. to $200 \times 10^{-6}/°$ C. or epoxy resin having the Young's modulus 1000 to 10000 Mpa. With the use of such a sealing portion 3, it is possible to have an advantageous effect that the solder flash caused by the expansion of solder in the inside of a package in a reflow at the time of mounting at a client side can be prevented. That is, when the semiconductor module 1 is mounted on the mounting substrate by performing the reflow using a bonding material such as solder, a phenomenon (solder flash phenomenon) in which the solder at the bonding portion of the electronic part incorporated into the inside of the sealing portion 3 of the semiconductor module 1 is expanded due to heat generated by the reflow and the solder leaks to the outside through an interface between the module board 2 and the sealing portion 3 is liable to easily occur. Since the thermal expansion coefficient $\alpha$ of the module board 2 is approximately $7 \times 10^{-6}/°$ C., by forming the sealing portion 3 using the resin having the above-mentioned Young's modulus and, thermal expansion coefficient, the adhesive strength between the module board 2 and the sealing portion 3 can be enhanced whereby the generation of the solder flash phenomenon can be suppressed.

Figure 8:
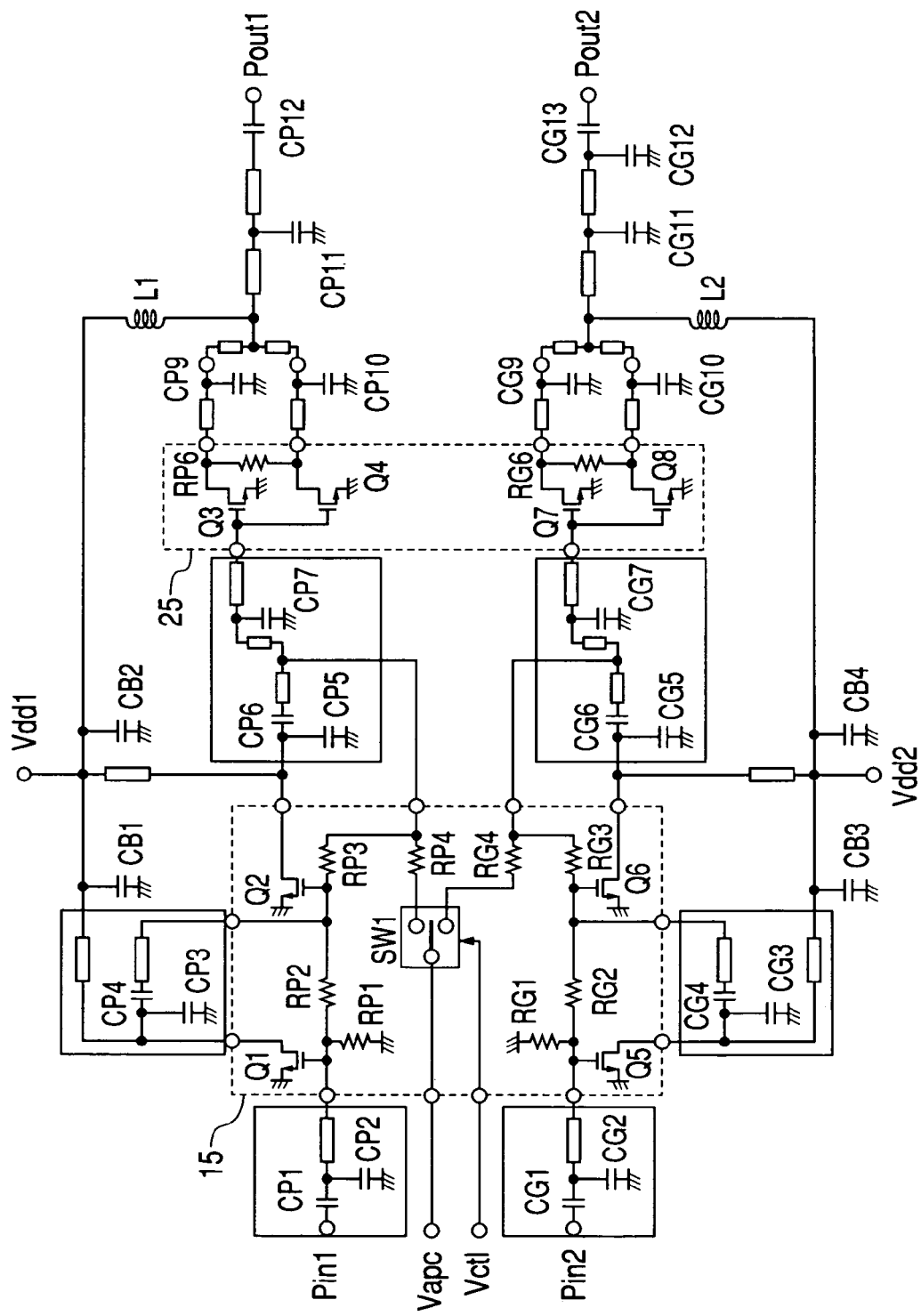
FIG. 8 is an equivalent circuit diagram of the semiconductor module.

The semiconductor module 1 of this embodiment 1 constitutes a high frequency power amplifying device. FIG. 8 shows the circuit constitution of the high frequency power amplifying device. This high frequency power amplifying device adopts the constitution which amplifies two types of communication systems, wherein an amplifying system which amplifies each communication system adopts the three-stage constitution which connects transistors in three stages sequentially. For example, one communication system adopts a DCS (Digital Cellular System 1800) method in which a frequency band is 1710 to 1785 MHz and another communication system adopts a GSM (Global System for Mobile Communication) method in which a frequency band is 880 to 915 MHz.

As shown in FIG. 8, one communication system is configured such that an initial-stage transistor (an initial-stage amplifier: a first amplifying stage) Q1, a next-stage transistor (a next-stage amplifier: a second amplifying stage) Q2 and final-stage transistors (output-stage amplifiers) Q3, Q4 which are connected in parallel are sequentially connected between an input terminal Pin1 and an output terminal Pout1. A power source voltage Vdd1 is connected to drain electrodes of respective transistors and gate electrodes of respective transistors are biased by a voltage inputted from a control terminal Vapc.

Further, another communication system is configured such that an initial-stage transistor Q5, a next-stage transistor Q6 and final-stage transistors (output-stage amplifiers) Q7, Q8 which are connected in parallel are sequentially connected between an input terminal Pin2 and an output terminal Pout2. A power source voltage Vdd2 is applied to drain electrodes of respective transistors and gate electrodes of respective transistors are biased by a control voltage inputted from the control terminal Vapc.

The control terminal Vapc is connected to a switch SW1, wherein the switch SW1 is changed over in response to a changeover signal from a changeover terminal Vct1 and a control voltage of the control terminal Vapc is configured to perform the amplification of the communication system specified by the switch SW1.

The transistors Q1, Q2, Q5, Q6 are formed over the first semiconductor chip 15 in a monolithic manner, while the output-stage transistors Q3, Q4, Q7, Q8 are formed over the second semiconductor chip 25 in a monolithic manner.

In both communication systems, a large number of capacitive elements (CP, CG, CB) which are indicated by C, a large number of resistance elements (RP, RG) which are indicated by R and a large number of inductors which are indicated by L are incorporated into both communication systems thus constituting matching circuits and bias circuits.

For example, in one communication system, capacitive elements which are indicated by CP1 to CP7, CP9 to CP12 and CB1, CB2, the resistance elements which are indicated by RP1 to RP4 and RP6, the inductor elements indicated by L1 and a strip line (a micro strip line) which is indicated by a rectangular shape are incorporated.

Further, in another communication system, capacitive elements which are indicated by CG1 to CG7, CG9 to CG13 and CB3, CB4, the resistance elements which are indicated by RG1 to RG4 and RG6, the inductor elements indicated by L2 and a strip line (a micro strip line) which is indicated by a rectangular shape are incorporated.

Figure 6:
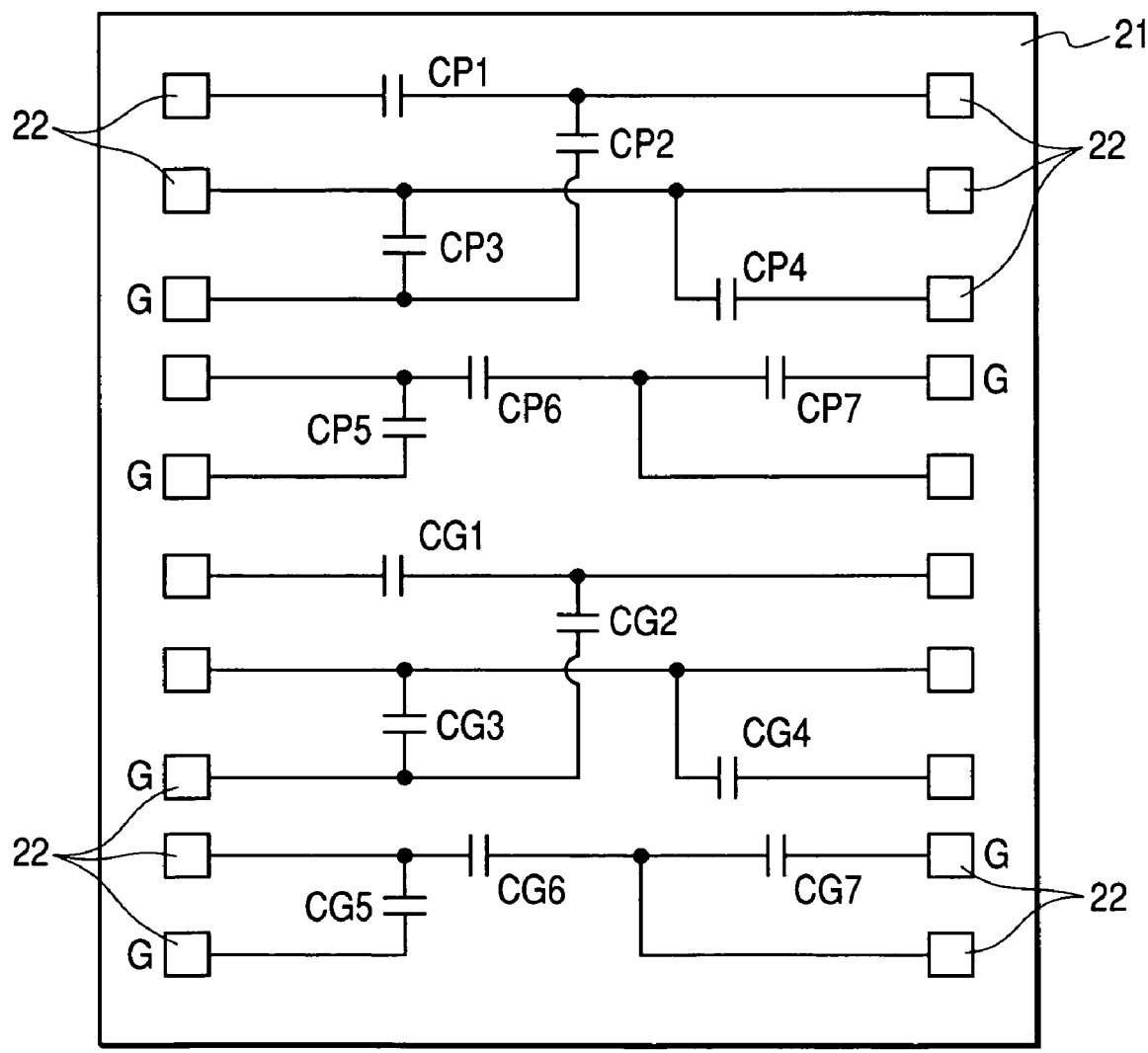
FIG. 6 is a schematic plan view showing the circuit constitution of integrated passive parts incorporated into the semiconductor module.

In the integrated passive device 21, a matching circuit which is indicated by a quadrangular frame in FIG. 8 is incorporated. FIG. 6 is a schematic plan view showing the capacitive elements which are incorporated into the integrated passive device 21 substantially as an equivalent circuit. On an upper surface of the integrated passive device 21, as shown in FIG. 6, electrodes 22 are provided along both sides of the integrated passive device 21. G shown at one side of the electrode 22 which is indicated by a quadrangular shape means a ground terminal.

In one communication system, the capacitive elements CP1 and CP2 form an input matching circuit of the initial-stage transistor Q1, the capacitive elements CP3 and CP4 form an inter-stage matching circuit between the initial-stage transistor Q1 and the next-stage transistor Q2, and the capacitive elements CP5 to CP7 form an inter-stage matching circuit between the next-stage transistor Q2 and the final-stage (output-stage) transistors Q3, Q4. Further, in another communication system, the capacitive elements CG1 and CG2 form an input matching circuit of the initial-stage transistor Q5, the capacitive elements CG3 and CG4 form an inter-stage matching circuit between the initial-stage transistor Q5 and the next-stage transistor Q6, and the capacitive elements CG5 to CG7 form an inter-stage matching circuit between the next-stage transistor Q6 and the output-stage transistors Q7, Q8. These matching circuits are incorporated into the integrated passive device 21 as shown in FIG. 6.

Figure 7:
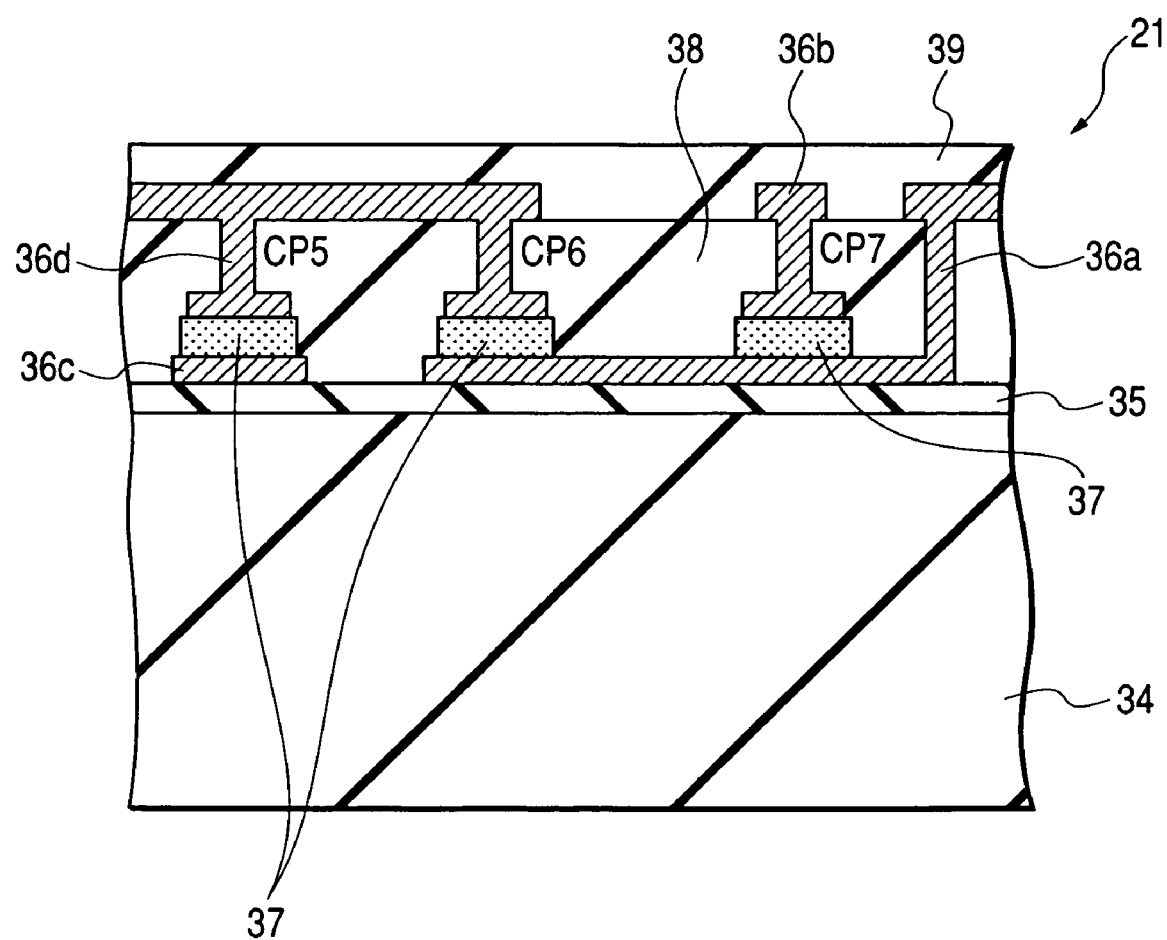
FIG. 7 is a schematic cross-sectional view showing some of the integrated passive parts.

FIG. 7 is a schematic cross-sectional view showing a portion of the integrated passive device 21. In this cross-sectional view, the capacitive elements CP5, CP6, CP7 which form the inter-stage matching circuit between the next-stage transistor Q2 and the final-stage (output-stage) transistors Q3, Q4 are shown. One of electrodes of the capacitive element CP5 is connected to the electrode 22 (the left-side electrode in FIG. 6) formed over the upper surface of the integrated passive device 21 and one of electrodes of the capacitive element CP7 is connected to the electrode 22 (the right-side electrode in FIG. 6) formed over the upper surface of the integrated passive device 21. These electrodes 22 are, as shown in FIG. 4, electrically connected to the wire connection pads 8 which are positioned around the first semiconductor chip 15 through the wires 23.

The integrated passive device (hereinafter also referred to as "IPD") 21 is formed, as shown in FIG. 7, such that on a main surface of a board 34 which is formed of a glass plate or the like having an insulation layer 35 on the main surface, conductive layers and insulation layers are repeatedly stacked at give positions and in a predetermined shape. In the midst stage of the formation of the integrated passive device 21, a dielectric layer is formed between predetermined conductive layers whereby the capacitive element (the capacitor) is formed as shown in FIG. 7. Further, although not shown in the drawing, it is possible to form a resistance element by interposing a resistance material between predetermined conductive layers and an inductance element (an inductor) can be formed by arranging the conductive layers in a vortex form.

In FIG. 7, numerals 36a, 36b, 36c, 36d indicate conductive layers, numeral 37 indicates a dielectric layer and numerals 38 and 39 indicate insulation layers. The electrodes 22 shown in FIG. 6 are exposed at regions where the insulation layer 39 which constitutes an uppermost protective film is not formed. The electrodes 22 have the flat structure which is suitable for wire bonding (see FIG. 1 and FIG. 6). Further, the electrodes 22 may be formed into bump electrodes for enabling the flip-chip connection. FIG. 7 shows the capacitive elements CP5, CP6, CP7 which are formed in this manner.

The IPD has been popularly used since a large number of passive elements can be incorporated in a miniaturized form. As the IPD, there have been known the structure which form respective passive parts by sequentially forming thin films made of a conductor or a dielectric on a printed wiring board and the structure which forms a diffusion region of a predetermined pattern and, at the same time, forms insulation layers, wiring and the like on a main surface of a semiconductor board so as to form respective passive parts.

The capacitors used in this embodiment 1have the capacity value of approximately 1 to 50 pF and an area of the dielectric layer 38 per one capacitor is approximately 300 $\mu m^2$ and hence, as shown in FIG. 6, the integrated passive device 21 into which approximately 14 capacitors are incorporated has a miniaturized size of approximately 1 mm in the longitudinal direction and 1 mm in the lateral direction whereby integrated passive device 21 can be sufficiently mounted on the first semiconductor chip 15. Such an integrated passive device 21 can largely reduce the mounting area by miniaturization to an amount which is approximately 30% of an area necessary for mounting 14 discrete chip capacitors.

FIG. 5 is a schematic view showing the first semiconductor chip 15, the second semiconductor chip 25, the electronic part 30 and the like which are mounted and arranged on the upper surface of the module board 2. Here, the wires and the solders are omitted from the drawing.

According to the semiconductor module 1 of this embodiment 1, the second semiconductor chip 25 which incorporates the output-stage transistor whose heat value is large is fixed to the bottom of the recess 10 and hence, the heat radiation is effectively conducted, while the first semiconductor chip 15 which incorporates the initial-stage and next-stage transistors whose heat values are sufficiently small compared to the heat value of the output-stage transistor is mounted on the upper surface of the module board 2.

Further, in this embodiment 1, the input matching circuit, the bias matching circuit and the output matching circuit for the output-stage transistors Q3, Q4, Q7, Q8 are constituted of discrete parts having small tolerance. That is, this embodiment does not use discrete parts having the usual tolerance (10 Ω±5%) but uses discrete parts having the narrow tolerance (10 Ω±1%). Accordingly, it is possible to enhance the characteristics (power efficiency) by approximately 2%, for example.

Further, in the manufacture of the semiconductor module 1, as the discrete parts which constitute the output matching circuit of the final-stage amplifier, a plurality of discrete parts which differ in characteristics respectively are prepared and, in the final tuning for improving the characteristics, the discrete parts are selected in conformity with the characteristics and are mounted on the module board 2 whereby the semiconductor module 1 having the favorable characteristics can be manufactured.

According to this embodiment 1, it is possible to obtain following advantageous effects.

(1) Since the semiconductor module 1 of this embodiment adopts the three-dimensional mounting structure which mounts and arranges the integrated passive device 21 on the upper surface of the first semiconductor chip 15 which is mounted on the upper surface of the module board 2, the semiconductor module 1 can be miniaturized compared to the structure which mounts the first semiconductor chip and the integrated passive device in parallel on the upper surface of the module board 2.

(2) Since the integrated passive device 21 is formed by integrating the plurality of capacitors, the semiconductor module 1 can be miniaturized compared to the structure which mounts the discrete capacitor parts (discrete parts) on the module board 2. Further, by mounting such an integrated passive device 21 on the first semiconductor chip 15, it is possible to achieve the further miniaturization of the semiconductor module 1.

(3) In the integrated passive device 21, the input matching circuit and the output matching circuit for the initial-stage transistors (amplifiers) Q1, Q5 are incorporated. Further, the integrated passive device 21 is mounted on the first semiconductor chip 15 in which the initial-stage amplifiers Q1, Q5 are incorporated. Accordingly, the initial-stage amplifiers Q1, Q5, the input matching circuit and the output matching circuit are arranged close to each other and hence, loss and impedance fluctuation with respect to RF (high frequency) can be reduced.

(4) Since the input matching circuit, the bias matching circuit and the output matching circuit for the output-stage transistors Q3, Q4, Q7, Q8 are constituted of the discrete parts having small tolerance, it is possible to enhance the characteristics (power efficiency). For example, the power efficiency can be enhanced by approximately 2%.

(5) Since the semiconductor module adopts the structure in which the second semiconductor chip 25 having the large heat value is fixed onto the bottom of the recess 10 formed in the upper surface of the module board 2, heat can be rapidly transferred to the heat radiation pad 5 on the lower surface of the module board 2 through the vias 11 whereby it is possible to provide the semiconductor module 1 (high frequency power amplifying device) having high heat radiation property. Accordingly, a mobile telephone in which this semiconductor module 1 is incorporated can be operated in a stable manner due to the favorable heat radiation property of the semiconductor module 1.

Here, a modification of the embodiment 1is explained. In the drawings served for explaining the modification, symbols necessary for the explanation are given and some symbols are omitted.

Figure 9:
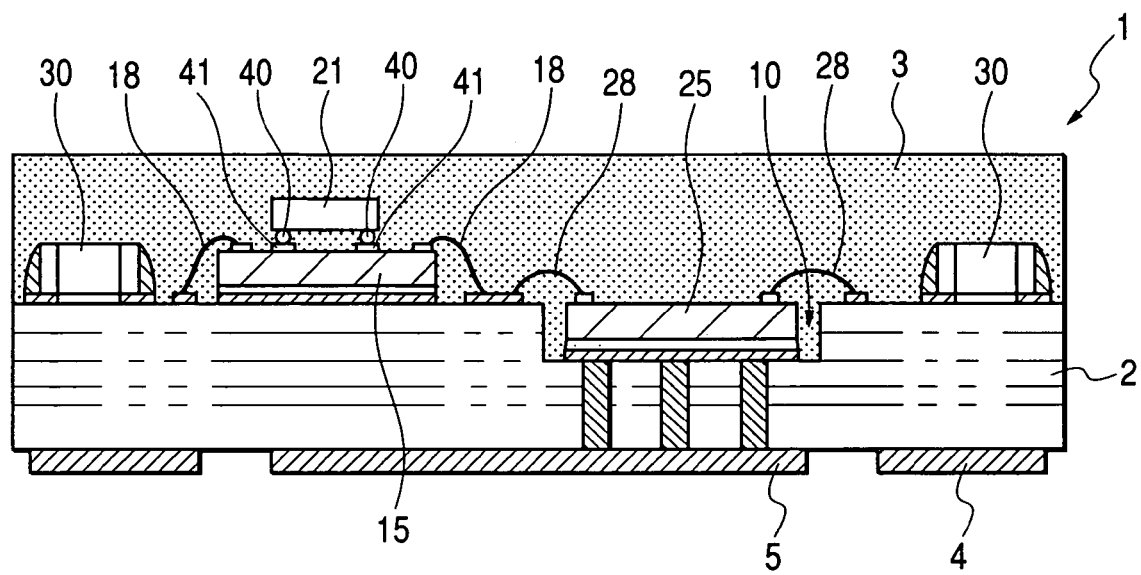
FIG. 9 is a schematic cross-sectional view of a semiconductor module which constitutes a first modification of the embodiment 1.

FIG. 9 is a schematic cross-sectional view of a semiconductor module which constitutes the first modification. The semiconductor module 1 of this modification is characterized in that, in the embodiment 1, on the upper surface of the first semiconductor chip 15 which is mounted on the upper surface of the module board 2, the integrated passive device 21 is mounted using the flip-chip connection. Accordingly, as shown in FIG. 9, electrodes of the integrated passive device 21 are formed as solder bump electrodes 40 in advance and, at the same time, electrodes 41 for flip-chip connection are formed over the upper surface of the first semiconductor chip 15 corresponding to the solder bump electrodes 40. Then, at the time of mounting the integrated passive device 21, respective solder bump electrodes 40 are overlapped to respective electrodes 41 and the solder bump electrodes 40 are softened by temporary heating (reflow) to establish the connection between the solder bump electrodes 40 and the electrodes 41.

In the semiconductor module 1 according to the first modification, the integrated passive device 21 is mounted on the upper surface of the first semiconductor chip 15 using the flip-chip connection and hence, wires are not used. Accordingly, there exists no fluctuation of inductance attributed to the wires and hence, it is possible to attain advantages that the characteristics are enhanced and, at the same time, the tuning can be simplified.

Figure 10:
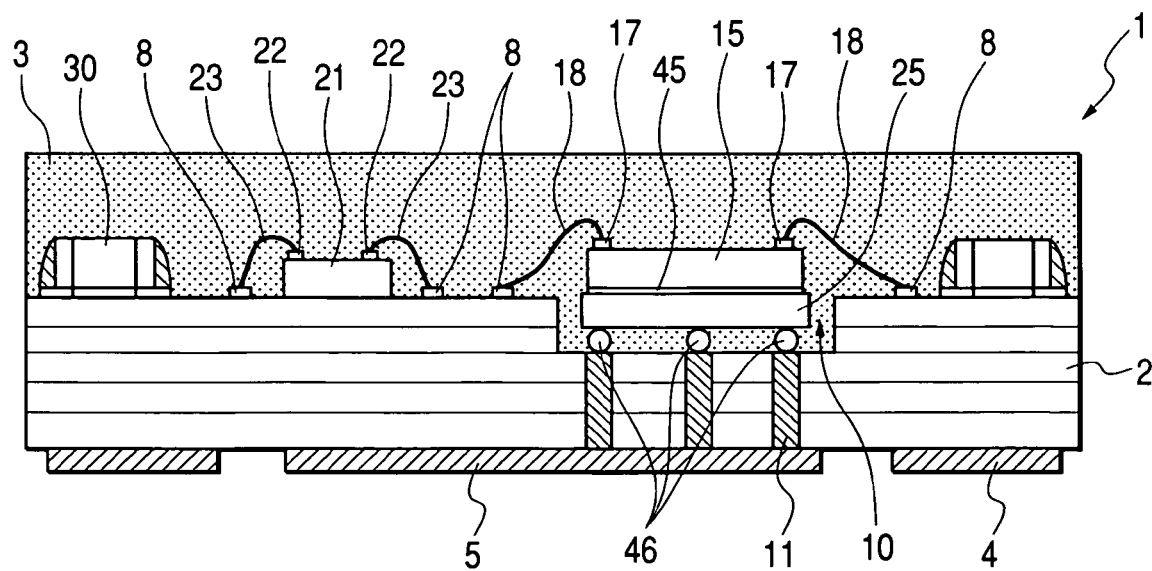
FIG. 10 is a schematic cross-sectional view of a semiconductor module which constitutes a second modification of the embodiment 1.

FIG. 10 is a schematic cross-sectional view in a simplified form of a semiconductor module which constitutes a second modification. The semiconductor module 1 of this modification is characterized in that, in the embodiment 1, the second semiconductor chip 25 is mounted on the bottom of the recess 10 formed over the upper surface of the module board 2 using the flip-chip connection, the first semiconductor chip 15 is mounted on the upper surface of the second semiconductor chip 25 by way of an insulation adhesive agent 45, and the electrodes 17 of the first semiconductor chip 15 and the wire connection pads 8 formed over the upper surface of the module board 2 around the recess 10 are electrically connected with each other using conductive wires 18. Further, the modification 2 adopts the structure in which the integrated passive device 21 is mounted on the upper surface of the module board 2 and the electrodes 22 formed over the upper surface of the integrated passive device 21 and the wire connection pads 8 which are formed over the upper surface of the module board 2 around the periphery of the integrated passive device 21 are electrically connected with each other using conductive wires 23. In this modification, electrodes of the second semiconductor chip 25 are formed as solder bump electrodes 46 in advance and, at the same time, electrodes for flip-chip connection (not shown) are formed over the bottom of the recess 10 corresponding to the solder bump electrodes 46. Then, at the time of mounting the second semiconductor chip 25, respective solder bump electrodes 46 are overlapped to respective electrodes formed over the bottom of the recess 10 and the solder bump electrodes 46 are softened by temporary heating (reflow) to establish the connection between the solder bump electrodes 46 and the electrodes.

Figure 11:
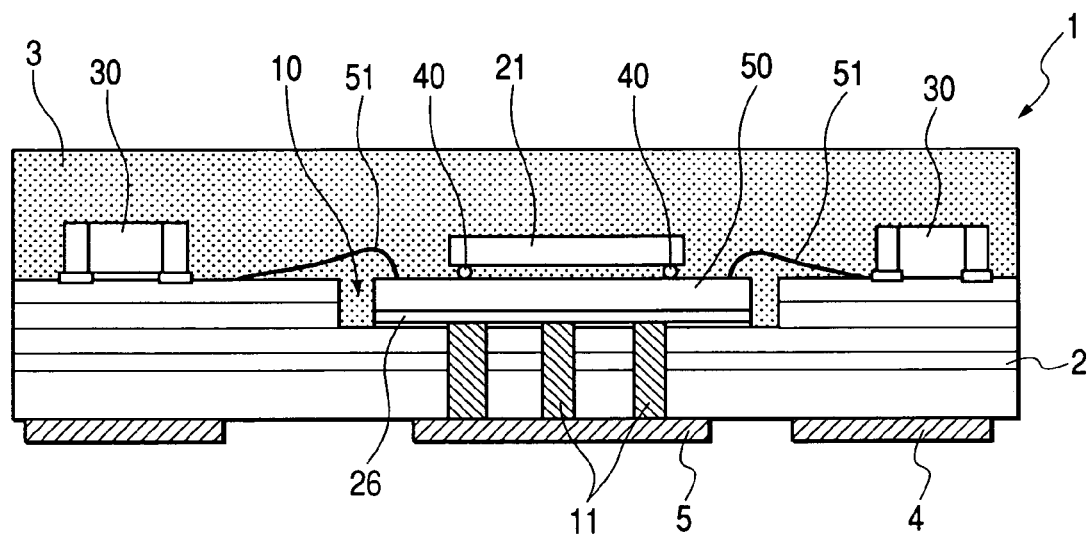
FIG. 11 is a schematic cross-sectional view of a semiconductor module which constitutes a third modification of the embodiment 1 in a simplified form.

In this modification, the grounds of the next-stage and final-stage amplifiers can be reinforced by the solder bump electrodes 46. Since the fluctuation of the ground potential in the initial-stage amplifier is small, the constitution which connects the electrodes 17 and the wire connection pads 8 using the wires 18 can sufficiently cope with the fluctuation. FIG. 11 is a schematic cross-sectional view in a simplified form of a semiconductor module which constitutes a third modification. The semiconductor module 1 of this modification is characterized in that, in the embodiment 1, a semiconductor chip 50 in which initial-stage, next-stage and final-stage amplifies are incorporated is mounted on the bottom of the recess 10, electrodes (not shown) of the semiconductor chip 50 and wire connection pads (not shown) formed over the upper surface of the module board 2 are connected with each other using conductive wires 51, and the integrated passive device 21 formed over the upper surface of the semiconductor chip 50 is electrically connected with the electrodes (not shown) formed over the upper surface of the module board 2 by way of solder bump electrodes 40 using the flip-chip connection. Further, the output matching circuit is formed by combining discrete parts having narrow tolerance.

In this modification, there is no fluctuation of characteristics attributed to wires and hence, it is possible to exhibit the stable characteristics. It is also possible to have an advantageous effect that board pads for wire bonding are not necessary and hence, the further miniaturization can be realized.

In this embodiment 1, although the explanation has been made with respect to an example in which the initial-stage amplifier of the high frequency power amplifying device is incorporated into the first semiconductor chip 15, it is also possible to incorporate a control circuit which controls the high frequency power amplifying device into the first semiconductor chip 15. For example, as the control circuit, a circuit such an APC (automatic power control circuit), an AGC (automatic gain control circuit) or the like can be incorporated.

(Embodiment 2)

Figure 12:
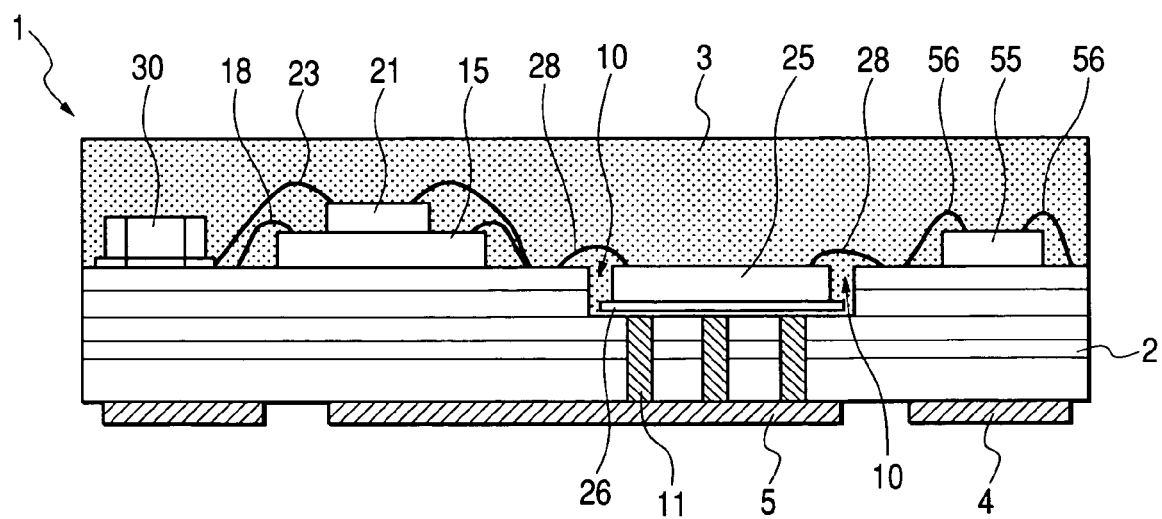
FIG. 12 is a schematic cross-sectional view showing a semiconductor module according to another embodiment (embodiment 2) of the present invention in a simplified form.
Figure 13:
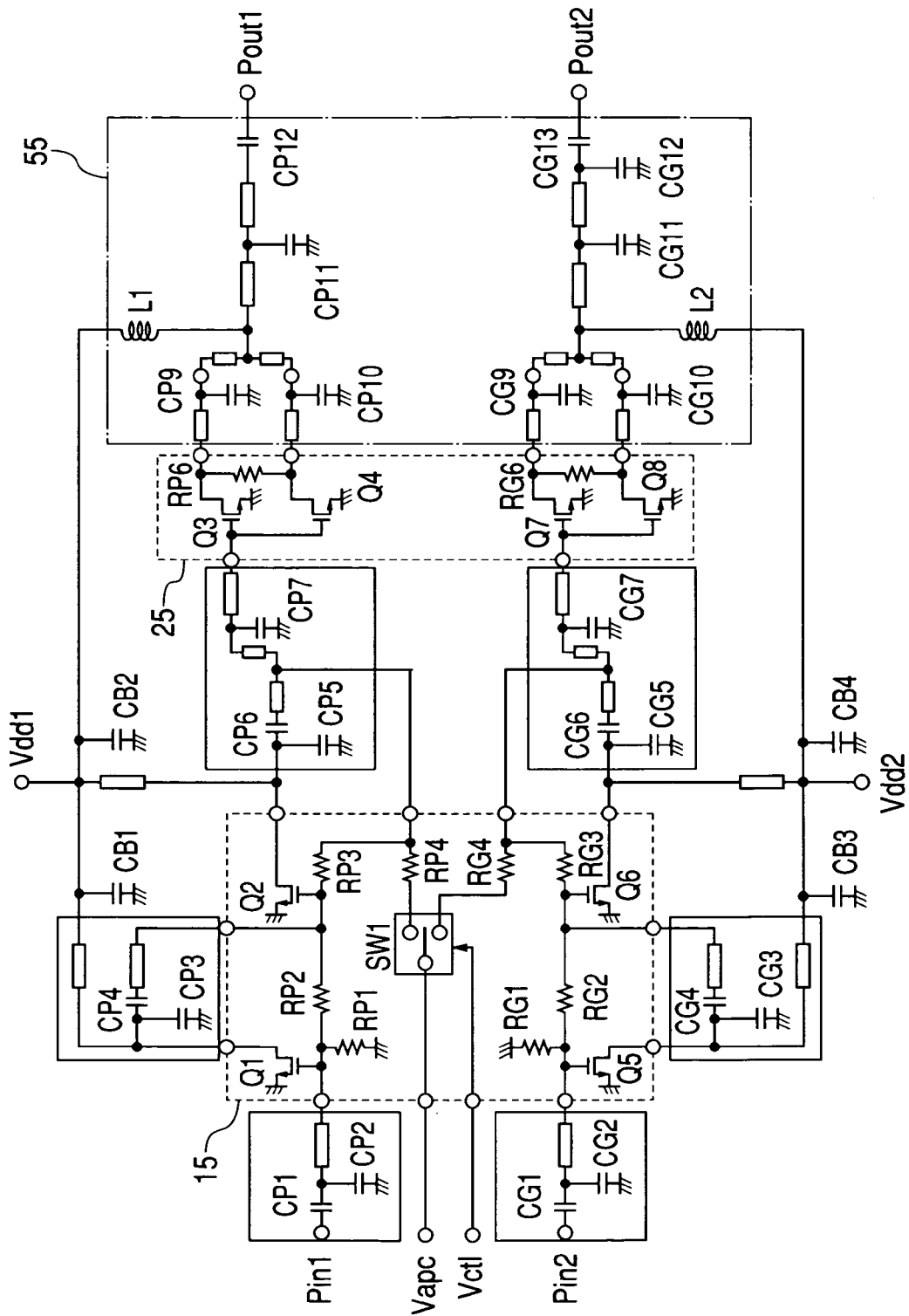
FIG. 13 is an equivalent circuit diagram of the semiconductor module of the embodiment 2.
Figure 14:
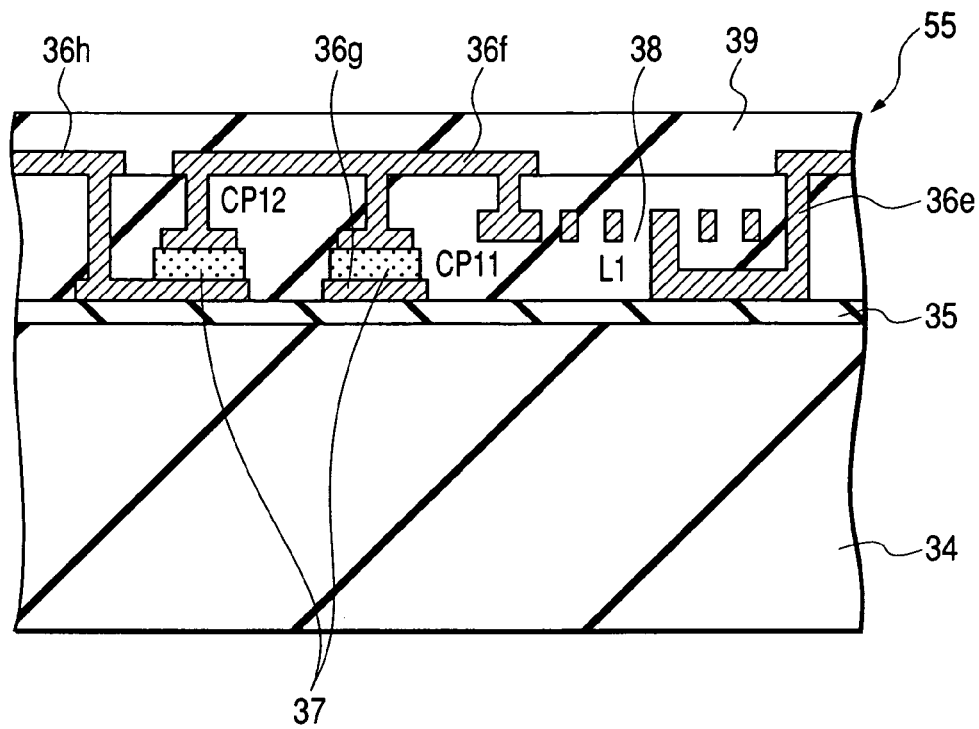
FIG. 14 is a cross-sectional view of integrated passive parts incorporated into the semiconductor module of the embodiment 2.

FIG. 12 to FIG. 14 are views related to a semiconductor module which constitutes another embodiment (embodiment 2) of the present invention. This embodiment is characterized in that, in the semiconductor module 1 of the embodiment 1, the output matching circuit is incorporated into an integrated passive device 55, the integrated passive device 55 is mounted on the upper surface of the module board 2, electrodes (not shown) formed over an upper surface of the integrated passive device 55 and wire connection pads (not shown) formed over an upper surface of the module board 2 around the integrated passive device 55 are electrically connected to each other using conductive wires 56. Accordingly, on the upper surface of the module board 2, discrete parts which constitute the output matching circuit are not mounted. Other constitutions of this embodiment 2 are equal to corresponding constitutions of the embodiment 1.

FIG. 13 is an equivalent circuit diagram of the semiconductor module 1 of this embodiment. So long as the equivalent circuit is concerned, this equivalent circuit is equal to the equivalent circuit shown in FIG. 8 served for the embodiment 1. A portion which is surrounded by a chain-line frame is a portion which is incorporated into the integrated passive device 55. That is, in the integrated passive device 55, the capacitive elements CP9 to CP12 and the inductor L1 which are provided between drain terminals of the final-stage (output-stage) transistors Q3, Q4 and the output terminal Pout1, and the capacitive elements CG9 to CG13 and the inductor L2 which are provided between drain terminals of the final-stage (output-stage) transistors Q7, Q8 and the output terminal Pout2 are incorporated.

FIG. 14 is across-sectional view of an integrated passive part which is incorporated into the semiconductor module and shows a portion where the capacitive elements CP12, CP11 and the inductor L1 are formed. The inductor L1 is formed by arranging a conductive layer in a vortex form. Here, numerals 36e, 36f, 36g, 36h indicate conductive layers.

In this embodiment, the output matching circuit is incorporated into the integrated passive device 55 and the integrated passive device 55 is mounted on the upper surface of the module board 2. Accordingly, compared to the structure which constitutes an output matching circuit by mounting a plurality of discrete parts on the upper surface of the module board 2, the semiconductor module 1 can be further largely miniaturized. Further, when the module board 2 is not made small, the further larger number of discrete parts can be mounted and hence, the further sophistication of the functions can be achieved.

Figure 15:
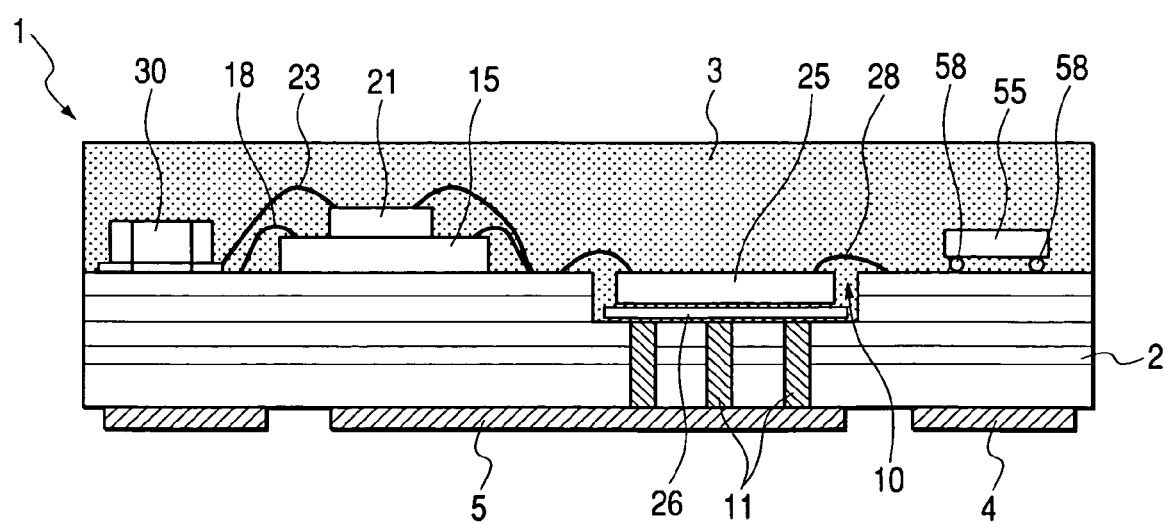
FIG. 15 is a schematic cross-sectional view showing a semiconductor module which constitutes a first modification of the embodiment 2 in a simplified form.

FIG. 15 is a schematic cross-sectional view showing a semiconductor module which constitutes a first modification of the embodiment 2in a simplified form. In this modification, electrodes of the integrated passive device 55 of the embodiment 2 constitute bump electrodes 58 and the integrated passive device 55 is a flip-chip mounted on a main surface of the module board 2 by way of the bump electrodes 58.

In this modification, since the integrated passive device 55 is mounted on the module board 2 by the flip-chip connection, wires are not used. Accordingly, it is possible to have advantages that there is no fluctuation of inductance attributed to the wires and hence, the characteristics are enhanced and, at the same time, the tuning can be simplified.

Figure 16:
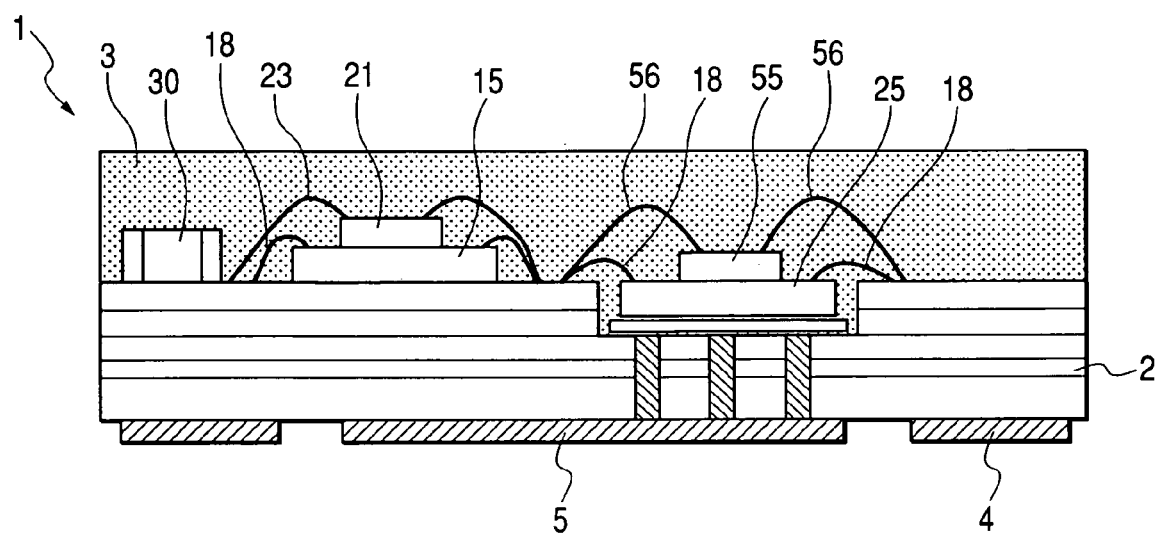
FIG. 16 is a schematic cross-sectional view showing a semiconductor module which constitutes a second modification of the embodiment 2 in a simplified form.

FIG. 16 is a schematic cross-sectional view showing a semiconductor module which constitutes a second modification of the embodiment 2in a simplified form. This modification 2 is characterized in that, in the semiconductor module 1 of the embodiment 1, the output matching circuit is incorporated into an integrated passive device 55, the integrated passive device 55 is mounted on the upper surface of the second semiconductor chip 25 mounted on the bottom of the recess 10, electrodes (not shown) formed over an upper surface of the integrated passive device 55 and wire connection pads (not shown) formed over an upper surface of the module board 2 around the recess 10 are electrically connected to each other using conductive wires 56. Accordingly, on the upper surface of the module board 2, discrete parts which constitute the output matching circuit are not mounted. Other constitutions of this modification 2 are equal to corresponding constitutions of the embodiment 1. In this modification, since the integrated passive device 55 in which the output matching circuit is incorporated is mounted on the second semiconductor chip 25, the module board can be further miniaturized. Alternatively, the further larger number of discrete parts can be mounted and hence, the further sophistication of the functions can be achieved.

(Embodiment 3)

Figure 17:
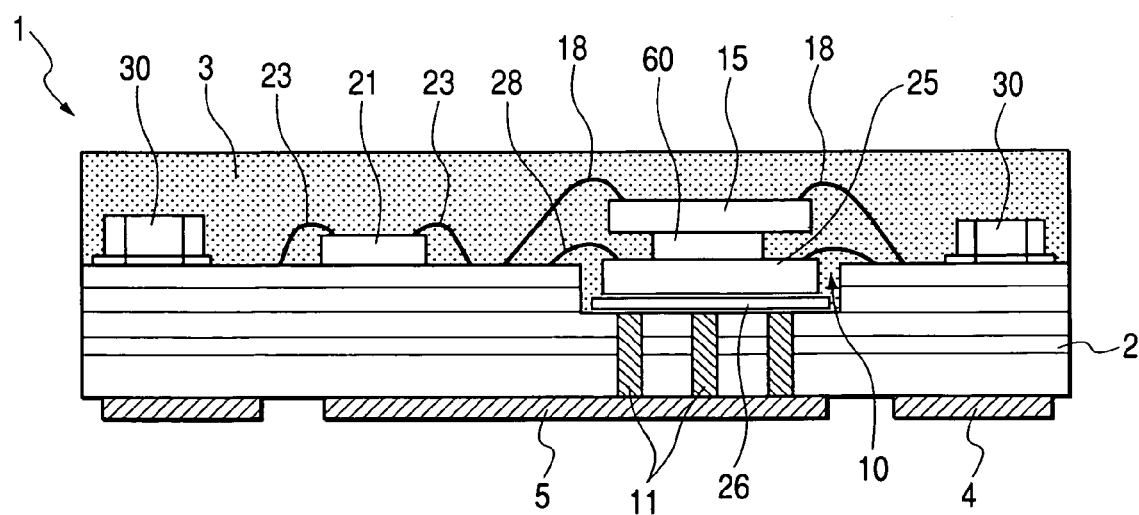
FIG. 17 is a schematic cross-sectional view of a semiconductor module according to another embodiment (embodiment 3) of the present invention in a simplified form.

FIG. 17 is a schematic cross-sectional view showing a semiconductor module which constitutes another embodiment (embodiment 3) of the present invention in a simplified form. The semiconductor module 1 of this embodiment 3 has the same structure as the structure of the semiconductor module 1 of the embodiment 1 except for a point that they differ in places where the first semiconductor chip 15 and the integrated passive device 21 are mounted.

That is, this embodiment adopts the structure in which on the second semiconductor chip 25 which is mounted on the bottom of the recess 10 of the module board 2, the first semiconductor chip 15 is mounted by way of the spacers 60 and, at the same time, the integrated passive device 21 is directly mounted on the upper surface of the module board 2.

The spacer 60 is fixed to the upper surface of the second semiconductor chip 25 by an adhesive agent (not shown) and the first semiconductor chip 15 is fixed to the spacer 60 by means of an adhesive agent (not shown). To prevent the first semiconductor chip 15 and the second semiconductor chip 25 from being electrically connected to each other through the spacer 60, the whole spacer 60 is formed of an insulation material or intermediate layers or surface layers of the chips are formed of a material which constitutes an insulation layer. When the electric insulation derived from the spacer 60 is sufficient, the adhesive agent may be made of either an insulation material or a conductive material. When the electric insulation is insufficient, as the adhesive agent, an adhesive agent having an insulation property may be used. Further, the spacer 60 may be formed of an insulation tape having adhesiveness on both surfaces thereof or the like.

The spacer 60 is made smaller than the second semiconductor chip 25 such that the spacer 60 is not brought into contact with electrodes (not shown) on the upper surface of the second semiconductor chip 25 and is fixed to a center of the second semiconductor chip 25. The first semiconductor chip 15 which is fixed to an upper surface of the spacer 60 is mounted such that a face on which the electrodes (not shown) are present constitutes an upper surface. The electrodes of the first semiconductor chip 15 and wire connection pads (not shown) which are formed over the upper surface of the module board 2 around the recess 10 are electrically connected to each other using conductive wires 18.

Electrodes (not shown) formed over the upper surface of the integrated passive device 21 which are mounted on the module board 2 and wire connection pads (not shown) formed over the upper surface of the module board 2 around the integrated passive device 21 are electrically connected to each other using conductive wires 23.

The first semiconductor chip 15 which is incorporated into the initial-stage amplifier exhibits a heat value smaller than a heat value of the second semiconductor chip 25 which incorporates the output-stage amplifier therein and hence, it is also possible to mount the first semiconductor chip 15 on the second semiconductor chip 25. By forming the spacer 60 using a material having the favorable heat conductivity, it is possible to rapidly transfer heat generated by the first semiconductor chip 15 to the heat radiation pad 5 through the spacer 60, the second semiconductor chip 25 and the vias 11.

According to the semiconductor module 1 of the embodiment 3, since the first semiconductor chip 15is mounted on the second semiconductor chip 25 without mounting the first semiconductor chip 15 on the upper surface of the module board 2, the module board 2 can be miniaturized by an amount that the first semiconductor chip 15 is not mounted on the module board 2. Further, when the module board 2 is not miniaturized, it is possible to mount other discrete parts and the like by an amount that the module board 2 is not miniaturized and hence, the sophistication of the functions can be achieved.

(Embodiment 4)

Figure 18:
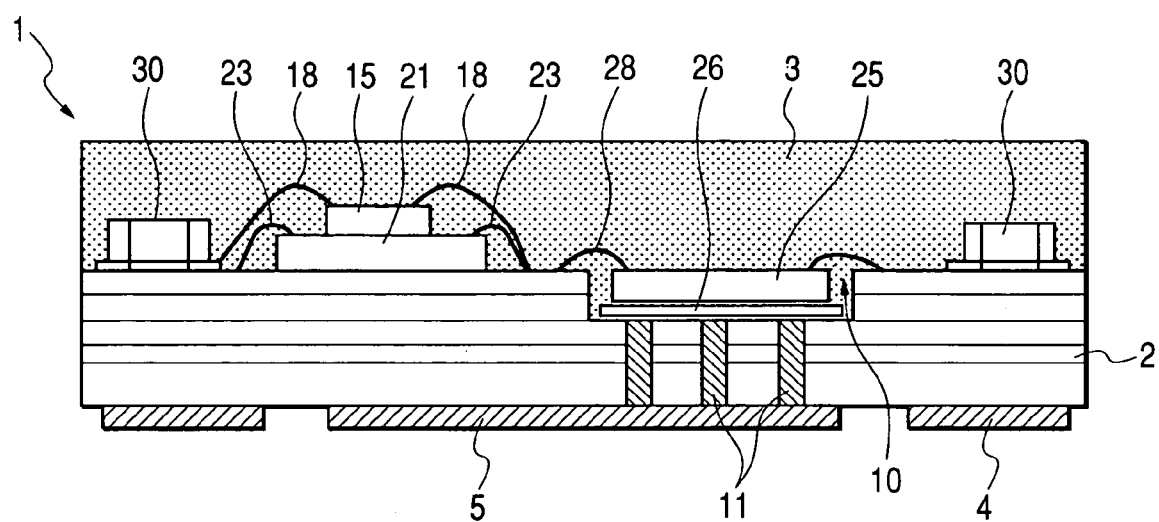
FIG. 18 is a schematic cross-sectional view of a semiconductor module according to another embodiment (embodiment 4) of the present invention in a simplified form.

FIG. 18 is a schematic cross-sectional view showing a semiconductor module according to another embodiment (embodiment 4) of the present invention in a simplified form. The semiconductor module 1 of this embodiment 4has the same constitution as the semiconductor module 1 of the embodiment 1 except for constitutions that the mounting relationship between the first semiconductor chip 15 and the integrated passive device 21 is reversed and the size of the integrated passive device 21 is made larger than the size of the first semiconductor chip 15.

That is, in this embodiment 4, the first semiconductor chip 15 is not directly mounted on the upper surface of the module board 2, the integrated passive device 21 is mounted on the upper surface of the module board 2 using an adhesive agent (not shown) with a posture that electrodes thereof are formed over an upper surface thereof, and the first semiconductor chip is mounted on the upper surface of the integrated passive device 21 using an adhesive agent (not shown).

The integrated passive device 21 is formed large enough such that the semiconductor chip 15 is not brought into contact with electrodes (not shown) of the integrated passive device 21 and the first semiconductor chip 15 is fixed to the center of the integrated passive device 21 such that the first semiconductor chip 15 is not brought into contact with the electrodes (not shown) of the integrated passive device 21.

The electrodes (not shown) formed over the upper surface of the integrated passive device 21 and the wire connection pads (not shown) formed over the upper surface of the module board 2 around the integrated passive device 21 are electrically connected to each other using the conductive wires. The electrodes (not shown) formed over the upper surface of the first semiconductor chip 15 on the integrated passive device 21 and the wire connection pads (not shown) formed over the upper surface of the module board 2 around the integrated passive device 21 are electrically connected to each other using conductive wires 18.

In case an inductor having a large area is incorporated into the integrated passive device 21, the size of the integrated passive device becomes larger than the semiconductor chip 15. This embodiment 4provides the structure which is effective in miniaturizing the semiconductor module in such a case. The capacity of the inductor in this case is 1 nH to 20 nH.

Figure 19:
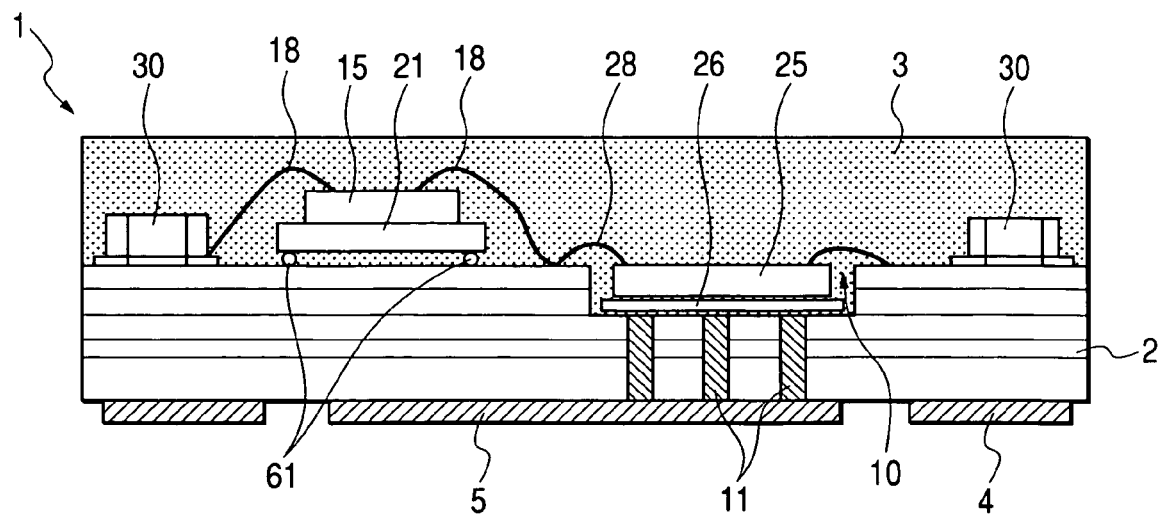
FIG. 19 is a schematic cross-sectional view showing a semiconductor module which constitutes a modification of the embodiment 4 in a simplified form.

FIG. 19 is a schematic cross-sectional view showing a semiconductor module which constitutes a modification of the embodiment 4in a simplified form. This modification differs from the semiconductor module 1 of the embodiment 4in that the integrated passive device 21 which mounts the first semiconductor chip 15 on the upper surface thereof is mounted on the upper surface of the module board 2 by the flip-chip connection.

In this modification, electrodes of the integrated passive device 21 of the embodiment 4constitute bump electrodes 61, the integrated passive device 21 is mounted on the upper surface of the module board 2 through the bump electrodes 61 by the flip-chip mounting, and the first semiconductor chip 15 is mounted on the upper surface of the integrated passive device 21 in a state that the electrodes thereof are formed over the upper surface.

In this modification, the electrodes of the integrated passive device 21 and the electrodes of the module board 2 are not connected to each other using wires. That is, these electrodes are electrically connected to each other using the bump electrodes and hence, it is possible to have advantageous effects that the fluctuation of the inductance attributed to wires is eliminated whereby the characteristics are enhanced and, at the same time, the tuning can be simplified.

(Embodiment 5)

Figure 20:
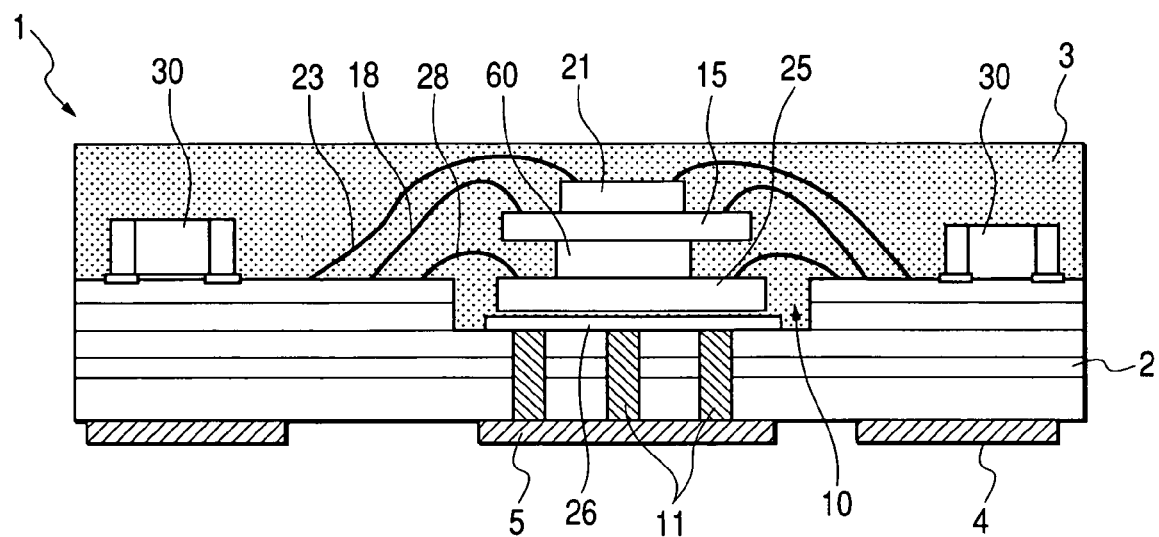
FIG. 20 is a schematic cross-sectional view of a semiconductor module according to another embodiment (embodiment 5) of the present invention in a simplified form.

FIG. 20 is a schematic cross-sectional view of a semiconductor module which constitutes another embodiment (Embodiment 5) of the present invention in a simplified form.

The semiconductor module 1 of this embodiment 5 is characterized in that, different from the integrated passive device 21 which is mounted on the upper surface of the module board 2 in the semiconductor module 1 of the embodiment 3, the integrated passive device 21 is mounted on the first semiconductor chip 15 which is mounted on the semiconductor chip 25 in an overlapped manner by way of the spacer 60. Other constitutional parts of this embodiment are equal to corresponding constitutional parts of the semiconductor module 1 of the embodiment 3.

The integrated passive device 21 mounted on the upper surface of the first semiconductor chip 15 is made smaller than the first semiconductor chip 15 such that the integrated passive device 21 is not brought into contact with electrodes (not shown) formed over the upper surface of the first semiconductor chip 15 and, at the same time, the integrated passive device 21 is mounted on the center position of the first semiconductor chip 15.

Electrodes (not shown) formed over the upper surface of the integrated passive device 21 and wire connection pads (not shown) formed over the upper surface of the module board 2 around the recess 10 are electrically connected with each other using conductive wires 23.

According to the semiconductor module 1 of the embodiment 5, since the integrated passive device 21 is mounted on the second semiconductor chip 25 without mounting the integrated passive device 21 on the upper surface of the module board 2, the module board 2 can be miniaturized by an amount that the integrated passive device 21 is not mounted on the module board 2. Further, when the module board 2 is not miniaturized, it is possible to mount other discrete parts and the like by an amount that the module board 2 is not miniaturized and hence, the sophistication of the functions can be achieved.

(Embodiment 6)

Figure 21:
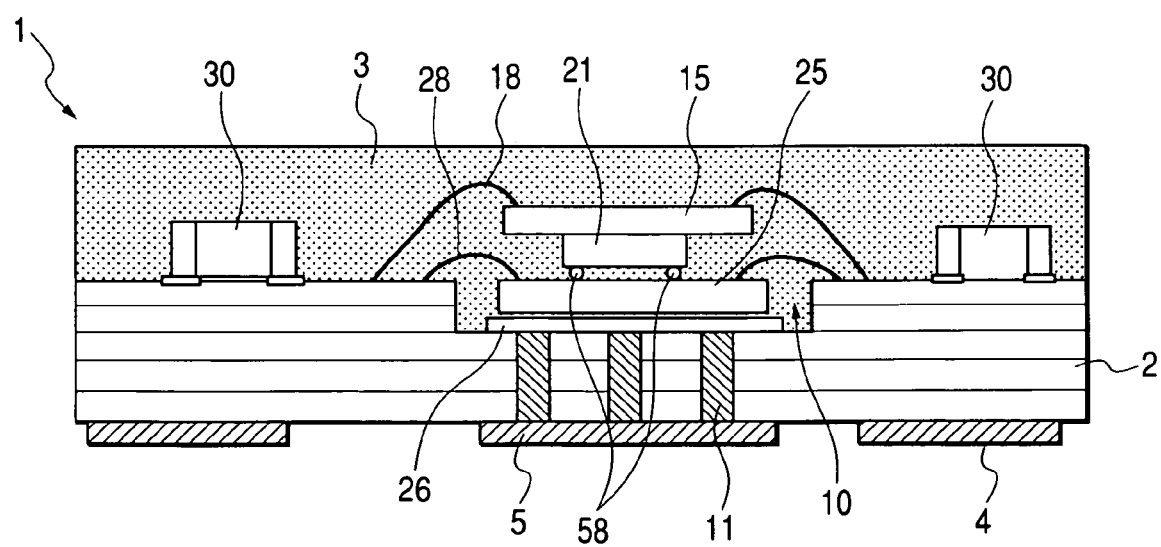
FIG. 21 is a schematic cross-sectional view of a semiconductor module according to another embodiment (embodiment 6) of the present invention in a simplified form.

FIG. 21 is a schematic cross-sectional view of a semiconductor module of another embodiment (embodiment 6) of the present invention in a simplified form.

The semiconductor module 1 of this embodiment 6 adopts the same constitution as the semiconductor module 1 of the embodiment 1 except for places where the first semiconductor chip 15 and the integrated passive device 21 are mounted.

That is, the semiconductor module 1 of this embodiment 6 adopts the structure in which the integrated passive device 21 having bump electrodes 58 is mounted by the flip-chip connection on the second semiconductor chip 25 which is mounted on the bottom of the recess 10 of the module board 2, the first semiconductor chip 15 is mounted on the upper surface of the integrated passive device 21 with a posture that the electrodes are formed over the upper surface, and electrodes (not shown) of the first semiconductor chip 15 and wire connection pads (not shown) formed over the upper surface of the module board 2 around the recess 10 are electrically connected to each other using conductive wires 18.

Although not shown in the drawing, respective bump electrodes 58 of the integrated passive device 21 are electrically connected to respective electrodes of the first semiconductor chip 15 and constitute a portion of the equivalent circuit shown in FIG. 8.

The semiconductor module 1 of this embodiment 6 is constituted such that the first semiconductor chip 15 and the integrated passive device 21 are mounted on the second semiconductor chip 25 without mounting the first semiconductor chip 15 and the integrated passive device 21 on the upper surface of the module board 2 and hence, the module board 2 can be miniaturized by an amount that the first semiconductor chip 15 and the integrated passive device 21 are not mounted. Further, when the module board 2 is not miniaturized, it is possible to mount other discrete parts or the like by an amount that the module 2 is not miniaturized and hence, the sophistication of the functions can be achieved.

Although the inventions made by the inventors have been specifically explained based on the embodiments, it is needless to say that the present invention is not limited to the above-mentioned embodiments and various modifications can be made without departing from the gist of the present invention. Although the MOSFET (Metal Oxide Semiconductor Field Effect Transistor) is used as the amplifier (transistor), the amplifier may be formed of a bipolar-based transistor which contains other silicon or compound semiconductors.

To briefly explain the advantageous effects obtained by typical inventions among inventions disclosed in this specification, they are as follows.

(1) Since the semiconductor module adopts the three-dimensional mounting structure which mounts the integrated passive device and other semiconductor chip on the upper surface of the semiconductor chip which is mounted on the upper surface of the module board, it is possible to achieve the miniaturization and the sophistication of functions of the semiconductor module.

(2) Since the integrated passive device is formed by integrating a plurality of passive elements, the semiconductor module can be miniaturized compared to the structure which mounts discrete parts on the module board. Further, since the integrated passive device can be mounted on the module board such that the integrated passive device is overlapped to the semiconductor chip, it is possible to achieve the further miniaturization of the semiconductor module.

(3) Since the semiconductor module adopts the structure in which the semiconductor chip which generates a large heat value is fixed to the bottom of the recess formed over the upper surface of the module board, it is possible to rapidly transfer heat to the heat radiation pads formed over the lower surface of the module board through the vias and hence, it is possible to provide the semiconductor module which exhibits high heat radiation property.

What is claimed is:

1. A semiconductor module comprising:
    a module board having a wiring over an upper surface thereof and external electrode terminals over a lower surface thereof;
    a first semiconductor chip and a second semiconductor chip formed over the module board and including active elements; and
    an integrated passive device, wherein one semiconductor chip out of the first semiconductor chip and the second semiconductor chip and the integrated passive device are mounted over an upper surface of the module board in an overlapped manner, and wherein the first semiconductor chip and the second semiconductor chip include an amplifying circuit and an output of the first semiconductor chip is inputted to the second semiconductor chip.

2. A semiconductor module according to claim 1, wherein an inter-stage matching circuit is provided between the first semiconductor chip and the second semiconductor chip and the inter-stage matching circuit is formed of the integrated passive device.

3. A semiconductor module according to claim 2, wherein the semiconductor module includes an input matching circuit which is connected to an input portion of the first semiconductor chip and an output matching circuit which is connected to an output portion of the second semiconductor chip, and the output matching circuit is formed by the connection of discrete parts.

4. A semiconductor module comprising:
a module board having a wiring over an upper surface thereof and external electrode terminals over a lower surface thereof;
a first semiconductor chip and a second semiconductor chip formed over the module board and including active elements; and
an integrated passive device,
wherein the first semiconductor chip is mounted over the second semiconductor chip,
wherein a heat value of the second semiconductor chip is larger than a heat value of the first semiconductor chip.

5. A semiconductor module according to claim 4, wherein discrete parts are mounted over an upper surface of the module board.

6. A semiconductor module according to claim 4, wherein the integrated passive device is arranged over the first semiconductor chip.

7. A semiconductor module according to claim 4, wherein the integrated passive device is mounted over an upper surface of the first semiconductor chip, and the second semiconductor chip is mounted over the integrated passive device.

8. A semiconductor module according to claim 7, wherein discrete parts are mounted over an upper surface of the module board.

9. A semiconductor module according to claim 4, wherein the first semiconductor chip and the second semiconductor chip include amplifying circuits, an output of the first semiconductor chip is configured to be inputted to the second semiconductor chip, and an inter-stage matching circuit is provided between the first semiconductor chip and the second semiconductor chip.

10. A semiconductor module according to claim 9, wherein the semiconductor module includes an input matching circuit which is connected to an input portion of the first semiconductor chip and an output matching circuit which is connected to an output portion of the second semiconductor chip, and the output matching circuit is formed by the connection of discrete parts.

11. A semiconductor module comprising:
a module board having a wiring over an upper surface thereof and external electrode terminals over a lower surface thereof;
a first semiconductor chip and a second semiconductor chip over which active elements are formed; and
a first integrated passive device,
wherein the first semiconductor chip and the second semiconductor chip are arranged at an upper surface side of the module board with a predetermined distance therebetween,
wherein the first integrated passive device is arranged over an upper surface of the first semiconductor chip, and
wherein discrete parts are mounted over an upper surface of the module board.

12. A semiconductor module according to claim 11, wherein a second integrated passive device is mounted over an upper surface of the module board, and the second integrated passive device is mounted over an upper surface of the second semiconductor chip.

13. A semiconductor module comprising:
a module board having a wiring over an upper surface thereof and external electrode terminals over a lower surface thereof;
a first semiconductor chip and a second semiconductor chip over which active elements are formed; and
a first integrated passive device,
wherein the first semiconductor chip and the second semiconductor chip are arranged at an upper surface side of the module board with a predetermined distance therebetween,
wherein the first integrated passive device is arranged over an upper surface of the first semiconductor chip, and
wherein a second integrated passive device is mounted over an upper surface of the module board, and semiconductor chips including an active element are not present between the second integrated passive device and the module board.

14. A semiconductor module according to claim 13, wherein discrete parts are mounted over the upper surface of the module board.

15. A semiconductor module comprising:
a module board having a wiring over an upper surface thereof and external electrode terminals over a lower surface thereof;
a first semiconductor chip and a second semiconductor chip over which active elements are formed; and
a first integrated passive device,
wherein the first semiconductor chip and the second semiconductor chip are arranged at an upper surface side of the module board with a predetermined distance therebetween,
wherein the first semiconductor chip and the second semiconductor chip include amplifying circuits, an output of the first semiconductor chip is configured to be inputted to the second semiconductor chip, an inter-stage matching circuit is provided between the first semiconductor chip and the second semiconductor chip, and the inter-stage matching circuit is comprised of the integrated passive device.

16. A semiconductor module according to claim 15, wherein the semiconductor module includes an input matching circuit which is connected to an input portion of the first semiconductor chip and an output matching circuit which is connected to an output portion of the second semiconductor chip, and the output matching circuit is formed by the connection of a plurality of discrete parts.

17. A semiconductor module comprising:
a module board having a wiring over an upper surface thereof and external electrode terminals over a lower surface thereof; and a first semiconductor chip and a second semiconductor chip formed over the module board and including active elements;

wherein the first semiconductor chip and the second semiconductor chip are arranged with a predetermined distance therebetween in the horizontal direction over an upper surface side of the module board, wherein the first integrated passive device is mounted over the first semiconductor chip, wherein the first semiconductor chip and the second semiconductor chip include amplifying circuits, wherein an output of the first semiconductor chip is configured to be inputted to the second semiconductor chip, wherein an inter-stage matching circuit is provided between the first semiconductor chip and the second semiconductor chip, and wherein the inter-stage matching circuit is comprised of the first integrated passive device.

18. A semiconductor module according to claim 17, wherein the semiconductor module includes an input matching circuit which is connected to an input portion of the first semiconductor chip and an output matching circuit which is connected to an output portion of the second semiconductor chip, and the output matching circuit is formed by the connection of discrete parts.

19. A semiconductor module according to claim 18, wherein the first semiconductor chip and the module board are electrically connected to each other by conductive wires and the first integrated passive device and the module board are electrically connected to each other by conductive wires.

20. A semiconductor module according to claim 18, wherein a second integrated passive device is mounted over an upper surface of the module board, and semiconductor chips including an active element are not present between the second integrated passive device and the module board.

21. A semiconductor module according to claim 20, wherein the second integrated passive device and the module board are electrically connected to each other by conductive wires.

22. A semiconductor module comprising:
a module board having a wiring over an upper surface thereof and external electrode terminals over a lower surface thereof; and
a first semiconductor chip and a second semiconductor chip including active elements,
wherein the first semiconductor chip and the second semiconductor chip are arranged with a predetermined distance therebetween in the horizontal direction over an upper surface side of the module board,
wherein the first integrated passive device is arranged below the first semiconductor chip,
wherein the first semiconductor chip and the second semiconductor chip include amplifying circuits,
wherein an output of the first semiconductor chip is configured to be inputted to the second semiconductor chip,
wherein an inter-stage matching circuit is provided between the first semiconductor chip and the second semiconductor chip, and
wherein the inter-stage matching circuit is comprised of the first integrated passive device.

23. A semiconductor module according to claim 22, wherein the semiconductor module includes an input matching circuit which is connected to an input portion of the first semiconductor chip and an output matching circuit which is connected to an output portion of the second semiconductor chip.

24. A semiconductor module according to claim 23, wherein the first integrated passive device is mounted over an upper surface of the module board by a flip-chip connection.

25. A semiconductor module comprising:
a module board having a wiring over an upper surface thereof and external electrode terminals over a lower surface thereof; and
semiconductor chips including an active element; and
an integrated passive device mounted over an upper surface of at least one of the semiconductor chips,
wherein the semiconductor chips include a first amplifying circuit and a second amplifying circuit,
wherein an output of the first amplifying circuit is configured to be inputted to the second amplifying circuit,
wherein an inter-stage matching circuit is provided between the first amplifying circuit and the second amplifying circuit, and
wherein the inter-stage matching circuit is comprised of the integrated passive device.

26. A semiconductor module according to claim 25, wherein the semiconductor module includes an output matching circuit which is connected to an output portion of the second amplifying circuit, and the output matching circuit is formed by the connection of a plurality of discrete parts.

27. A semiconductor module comprising:
a module board having a wiring over an upper surface thereof and external electrode terminals over a lower surface thereof;
a first semiconductor chip and a second semiconductor chip formed over the module board and including active elements; and
an integrated passive device,
wherein one semiconductor chip out of the first semiconductor chip and the second semiconductor chip and the integrated passive device are mounted over an upper surface of the module board in an overlapped manner,
wherein the semiconductor module includes a heat radiation pad which is formed over a lower surface of the module board and a plurality of vias which are formed such that the vias vertically penetrate the module board and have lower ends thereof connected to the heat radiation pad, and the second semiconductor chip is arranged over the plurality of vias, and
wherein a recess is formed in an upper surface of the module board, and the vias are formed in a bottom of the recess in a plural number, and the second semiconductor chip is mounted over the bottom of the recess.

28. A semiconductor module according to claim 27, wherein the first semiconductor chip, the second semiconductor chip and the integrated passive device are covered with a sealing portion made of insulating resin.

29. A semiconductor module according to claim 28, wherein end portions of the sealing portion are not positioned outside the end portions of the module board.

* * * * *